United States Patent
Iida et al.

(10) Patent No.: US 10,386,586 B2
(45) Date of Patent: Aug. 20, 2019

(54) SEMICONDUCTOR DEVICE AND MANUFACTURING METHOD THEREOF

(71) Applicant: Renesas Electronics Corporation, Tokyo (JP)

(72) Inventors: Tetsuya Iida, Ibaraki (JP); Yasutaka Nakashiba, Ibaraki (JP)

(73) Assignee: Renesas Electronics Corporation, Tokyo (JP)

( * ) Notice: Subject to any disclaimer, the term of this patent is extended or adjusted under 35 U.S.C. 154(b) by 4 days.

(21) Appl. No.: 15/832,795

(22) Filed: Dec. 6, 2017

(65) Prior Publication Data

US 2018/0180827 A1 Jun. 28, 2018

(30) Foreign Application Priority Data

Dec. 22, 2016 (JP) ................. 2016-249644

(51) Int. Cl.
| | |
|---|---|
| *G02B 6/12* | (2006.01) |
| *G02B 6/42* | (2006.01) |
| *H01S 5/022* | (2006.01) |
| *H01S 5/042* | (2006.01) |
| *H01S 5/02* | (2006.01) |
| *G02B 6/30* | (2006.01) |

(Continued)

(52) U.S. Cl.
CPC ....... *G02B 6/4239* (2013.01); *G02B 6/12004* (2013.01); *G02B 6/13* (2013.01); *G02B 6/30* (2013.01); *H01S 5/021* (2013.01); *H01S 5/0224* (2013.01); *H01S 5/02228* (2013.01); *H01S 5/02272* (2013.01); *H01S 5/0425* (2013.01); *G02B 2006/12061* (2013.01); *G02B 2006/12121* (2013.01); *G02B 2006/12123* (2013.01); *H01S 5/024* (2013.01)

(58) Field of Classification Search
CPC .................................... G02B 6/12; G02B 6/42
USPC ........................................................... 385/14
See application file for complete search history.

(56) References Cited

U.S. PATENT DOCUMENTS

| | | | | |
|---|---|---|---|---|
| 5,621,837 | A * | 4/1997 | Yamada | G02B 6/42 385/88 |
| 6,684,007 | B2 * | 1/2004 | Yoshimura | G02B 6/10 257/E23.01 |

(Continued)

FOREIGN PATENT DOCUMENTS

| | | |
|---|---|---|
| JP | 2015-191110 A | 11/2015 |
| JP | 2016-014766 A | 1/2016 |
| WO | 2014/156962 A1 | 10/2014 |

*Primary Examiner* — Kaveh C Kianni
(74) *Attorney, Agent, or Firm* — Mattingly & Malur, PC

(57) ABSTRACT

A Si photonics device includes: a first semiconductor chip; a second semiconductor chip having a laser diode and mounted on the first semiconductor chip; a third semiconductor chip taking in a laser beam emitted from the laser diode and mounted on the first semiconductor chip; and a resin layer disposed on the first semiconductor chip so as to face the second semiconductor chip. Further, the Si photonics device has: a bump electrode connecting the second semiconductor chip and an upper layer electrode pad provided on the resin layer of the first semiconductor chip; and a bump electrode connecting the first semiconductor chip and the third semiconductor chip, and the second semiconductor chip is mounted on the first semiconductor chip via the resin layer.

7 Claims, 21 Drawing Sheets

(51) Int. Cl.
*G02B 6/13* (2006.01)
*H01S 5/024* (2006.01)

(56) References Cited

U.S. PATENT DOCUMENTS

| | | | |
|---|---|---|---|
| 6,690,845 B1* | 2/2004 | Yoshimura | G02B 6/12002 257/E23.01 |
| 2002/0109074 A1* | 8/2002 | Uchida | G02B 6/42 250/214.1 |
| 2003/0179979 A1* | 9/2003 | Ouchi | G02B 6/132 385/14 |
| 2005/0201666 A1* | 9/2005 | Terada | G02B 6/4202 385/14 |
| 2008/0006894 A1* | 1/2008 | Tanaka | H01L 23/481 257/432 |
| 2008/0075405 A1* | 3/2008 | Wang | G02B 6/1221 385/14 |
| 2009/0315057 A1* | 12/2009 | Konishi | H01L 24/97 257/98 |
| 2010/0027947 A1* | 2/2010 | Dutta | G02B 6/12002 385/88 |
| 2010/0323297 A1* | 12/2010 | Yanagisawa | G02B 6/43 430/315 |
| 2011/0129182 A1* | 6/2011 | Yamamoto | G02B 6/43 385/14 |
| 2012/0155823 A1* | 6/2012 | Yamamoto | B29D 11/00663 385/130 |
| 2013/0330049 A1* | 12/2013 | Yanagisawa | G02B 6/42 385/88 |
| 2014/0119702 A1* | 5/2014 | Yamamoto | G02B 6/4214 385/126 |
| 2016/0062063 A1* | 3/2016 | Ogura | G02B 6/428 385/14 |

\* cited by examiner

SEMICONDUCTOR DEVICE AND MANUFACTURING METHOD THEREOF

CROSS-REFERENCE TO RELATED APPLICATION

The present application claims priority from Japanese Patent Application No. 2016-249644 filed on Dec. 22, 2016, the content of which is hereby incorporated by reference into this application.

TECHNICAL FIELD OF THE INVENTION

The present invention relates to a semiconductor device and a manufacturing technique thereof, and relates to, for example, a semiconductor device that performs optical communication and its manufacturing technique.

BACKGROUND OF THE INVENTION

A silicon photonics device is known as a semiconductor device that performs optical communication. In order to improve performance of the silicon photonics device, it is necessary to input a laser beam as a light emission source into an optical waveguide of a photonics chip with high accuracy and output the laser beam to an external optical fiber or an external optical waveguide.

Incidentally, for example, Japanese Patent Application Laid-open No. 2016-14766 (Patent Document 1) discloses a structure about an optical device having an optical waveguide, and also discloses a structure that minimizes loss of optical coupling at a time of inputting light into an optical spot size converter from an optical fiber.

In addition, for example, International Publication No. 2014/156962 (Patent Document 2) discloses a structure about optical axis alignment in a photoelectric hybrid device, and also discloses the optical axis alignment at a time of inputting light into an optical waveguide from a laser diode and outputting an optical signal through a grating coupler.

In addition, for example, Japanese Patent Application Laid-open No. 2015-191110 (Patent Document 3) discloses a structure about a technique for coupling optical waveguides, and also discloses coupling of the optical waveguides at a time of outputting, from the optical fiber(s), the light inputted into the optical waveguide, from the optical fiber.

SUMMARY OF THE INVENTION

In the structure of the optical device described in Patent Document 1 described above, it is difficult to precisely align the optical axis of the optical fiber with the optical waveguide. Also, a processing of a silicon substrate for fixing the laser diode is complicated in the structure of a photoelectric hybrid device described in Patent Document 2, and it is consequently difficult to secure accuracy of optical axis alignment of the laser beam. Furthermore, in an optical waveguide coupling structure described in Patent Document 3, it is difficult to align the optical axis of the optical fiber with a core portion of the optical waveguide with high accuracy.

The above and other objects and novel characteristics of the present invention will be apparent from the description of the present specification and the accompanying drawings.

A semiconductor device according to one example includes: a first semiconductor chip, a first electrode pad being formed on a main surface of the first semiconductor chip; a second semiconductor chip, a second electrode pad being formed on a main surface of the second semiconductor chip and being mounted on the main surface of the first semiconductor chip; and a third semiconductor chip, a third electrode pad being formed on a main surface of the third semiconductor chip and being mounted on the main surface of the first semiconductor chip. Further, the device has a resin layer provided on the main surface of the first semiconductor chip and disposed to face the main surface of the second semiconductor chip. Furthermore, the device has a first projecting electrode electrically connecting a fourth electrode pad and the second electrode pad of the second semiconductor chip, the fourth electrode pad being electrically connected to the first electrode pad and being provided on the resin layer, and a second projecting electrode electrically connecting the first electrode pad of the first semiconductor chip and the third electrode pad of the third semiconductor chip. Also, the second semiconductor chip includes a light emitting source, the third semiconductor chip has an optical waveguide for taking in light emitted from the light emitting source, the fourth electrode pad is disposed above the first electrode pad on the first semiconductor chip, and the second semiconductor chip is mounted on the first semiconductor chip via the resin layer.

Also, another semiconductor device according to one embodiment includes: a first semiconductor chip, a first electrode pad being formed on a main surface of the first semiconductor chip; a second semiconductor chip, a second electrode pad being formed on a main surface of the second semiconductor chip and being mounted on the main surface of the first semiconductor chip; and a third semiconductor chip, a third electrode pad being formed on a main surface of the third semiconductor chip and being mounted on the main surface of the first semiconductor chip. Further, the device has a plurality of projecting electrodes electrically connecting the first electrode pad of the first semiconductor chip and the second electrode pad of the second semiconductor chip, and electrically connecting the first electrode pad of the first semiconductor chip and the third electrode pad of the third semiconductor chip. Furthermore, the device has an interposer disposed between the first semiconductor chip and the second semiconductor chip and between the first semiconductor chip and the third semiconductor chip, a plurality of through holes being formed in the interposer. In addition, the second semiconductor chip includes a light emitting source, the third semiconductor chip has an optical waveguide for taking in light emitted from the light emitting source, and the plurality of projecting electrodes are respectively disposed in the plurality of through holes of the interposer.

In addition, a method of manufacturing a semiconductor device according to one embodiment includes: (a) preparing a first semiconductor chip, a second semiconductor chip including a light emitting source, and a third semiconductor chip taking in light emitted from the light emitting source; and (b) mounting an interposer on a main surface of the first semiconductor chip. Further, the method has (c) mounting the second semiconductor chip and the third semiconductor chip on the interposer so that the first semiconductor chip and the second semiconductor chip are electrically connected via a plurality of projecting electrodes and that the first semiconductor chip and the third semiconductor chip are electrically connected via the plurality of projecting electrodes. Furthermore, the method has (d) covering the first, second, and third semiconductor chips and the interposer with a resin, in which the interposer includes a convex portion, and in the (c), the second semiconductor chip and the third semiconductor chip are mounted on the interposer while each of the second semiconductor chip and the third semiconductor chip abuts on the convex portion of the interposer.

According to the above embodiments, performance of the semiconductor device can be improved.

BRIEF DESCRIPTIONS OF THE DRAWINGS

Figure 20:
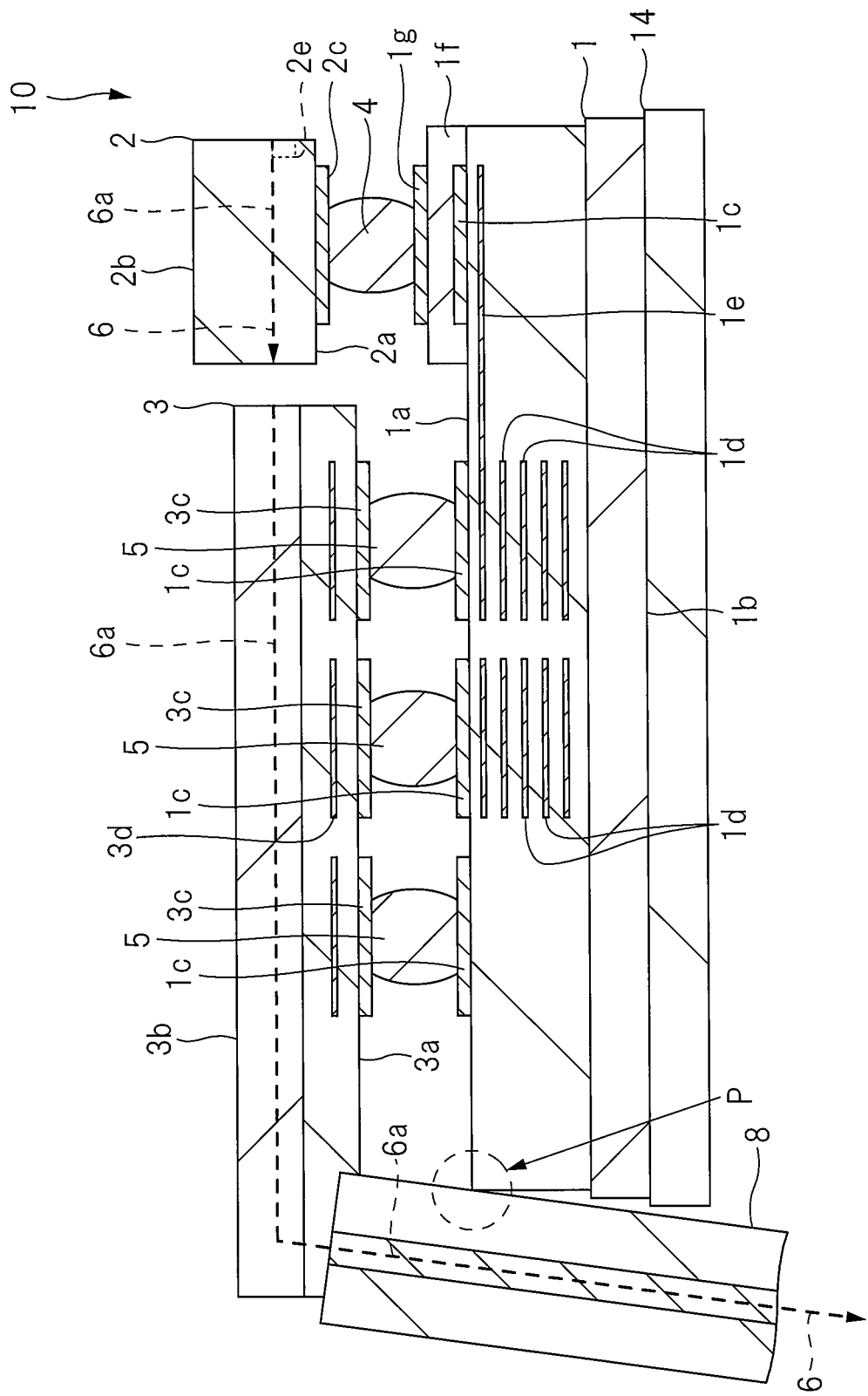
Figure 21:
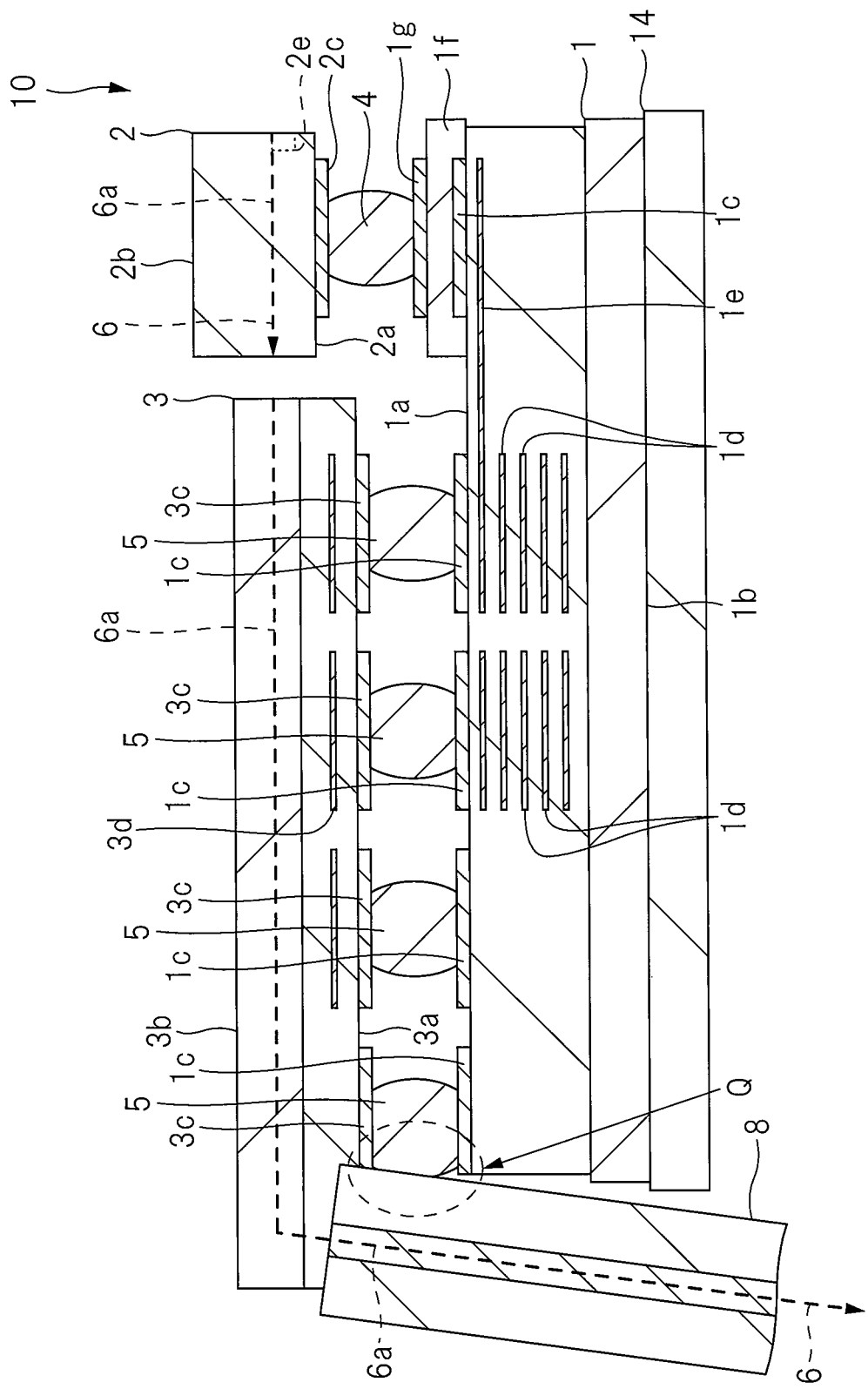

FIG. 20 is a cross-sectional view showing a structure when second and third semiconductor chips are mounted in assembly of a semiconductor device of a second modification example according to the fifth embodiment; and FIG. 21 is a cross-sectional view showing a structure when second and third semiconductor chips are mounted in assembly of a semiconductor device of a third modification example according to the fifth embodiment.

DESCRIPTIONS OF THE PREFERRED EMBODIMENTS

The description of the same or similar portions is not repeated in principle unless particularly required in the following embodiments.

Further, in the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

In addition, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

In addition, in the embodiments described below, it goes without saying that the components (including element steps) are not always indispensable unless otherwise stated or except the case where the components are apparently indispensable in principle.

In addition, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments according to the present invention will be detailed based on the accompanying drawings. Incidentally, components having the same function are denoted by the same reference characters throughout the drawings for describing the embodiments, and the repetitive description thereof is omitted. In addition, hatching is used even in a plan view so as to make the drawings easy to see.

First Embodiment

Figure 1:
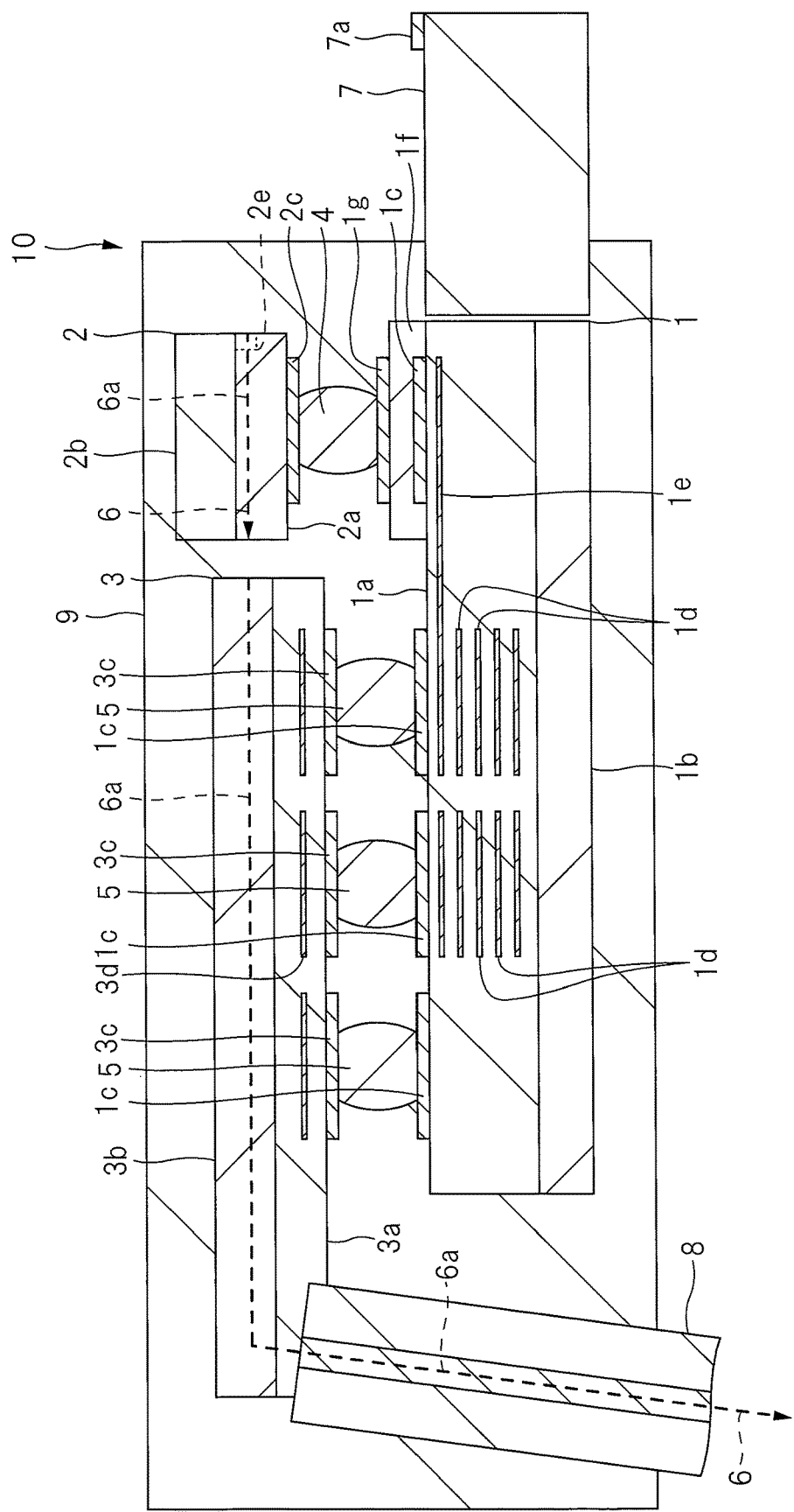
FIG. 1 is a cross-sectional view showing an example about a structure of a semiconductor device according to a first embodiment.
Figure 2:
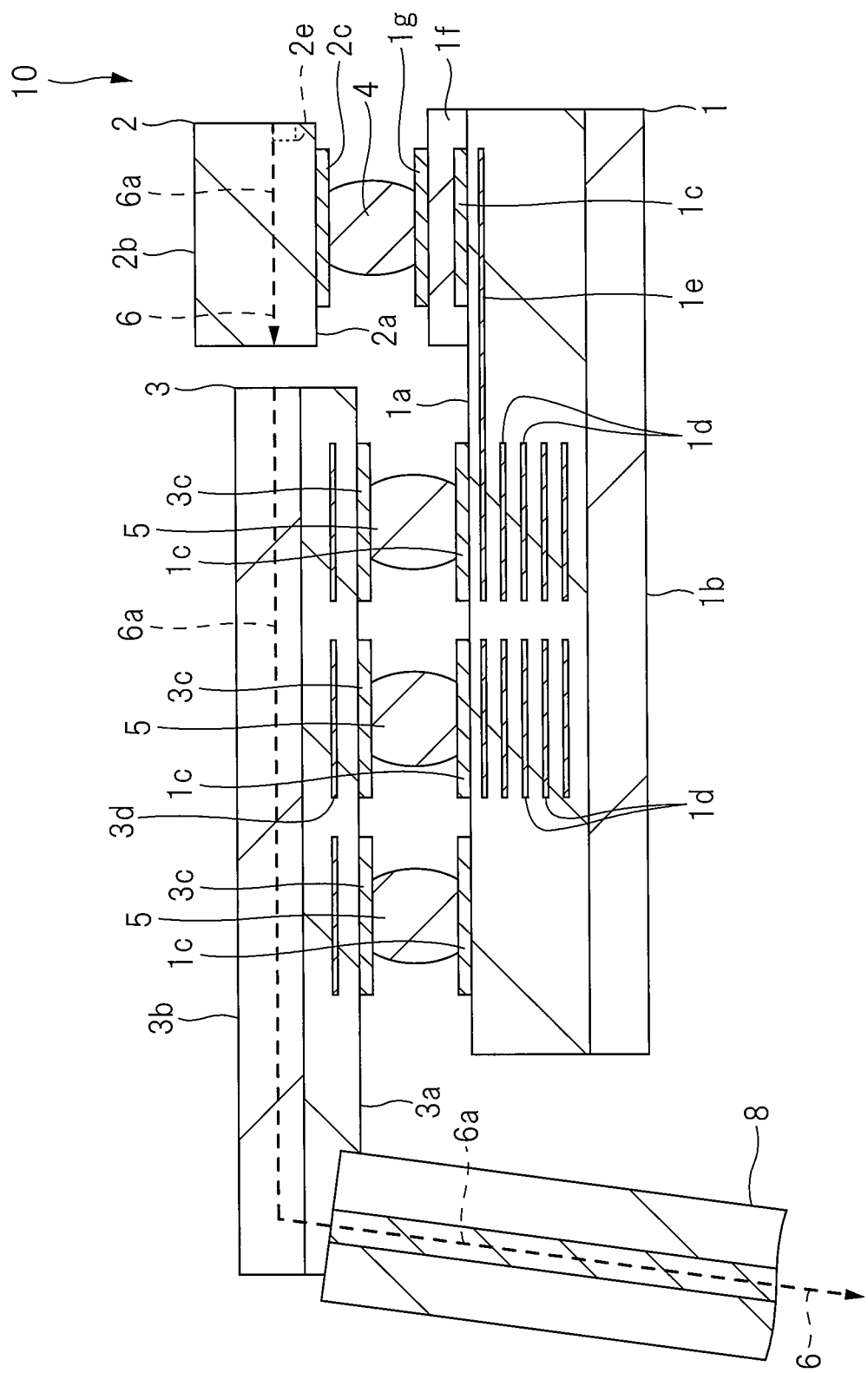
FIG. 2 is a cross-sectional view showing an example about a structure of a main part of the semiconductor device shown in FIG. 1.
Figure 3:
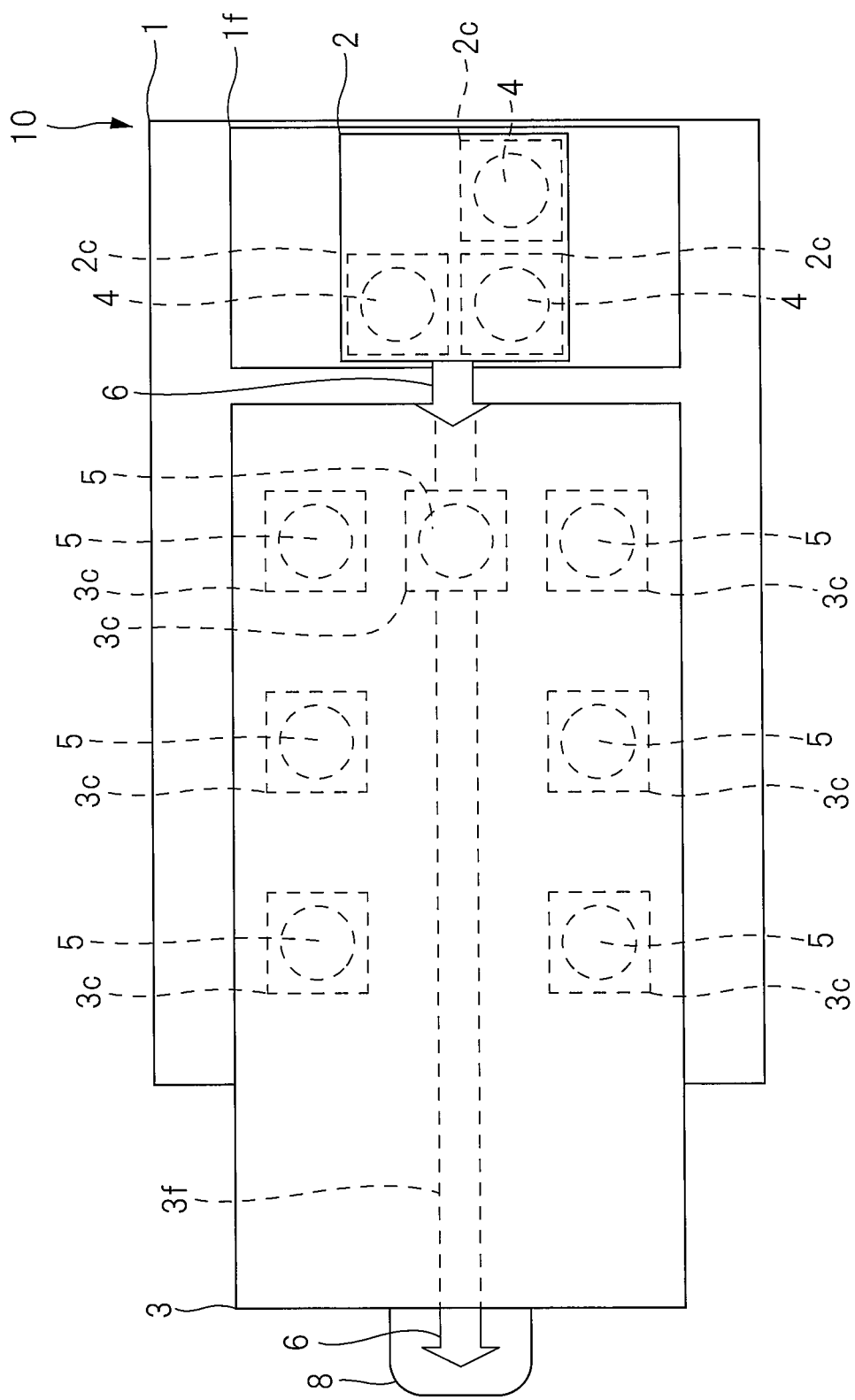
FIG. 3 is a plan view of the structure about the main part of the semiconductor device shown in FIG. 2.

FIG. 1 is a cross-sectional view showing an example about a structure of a semiconductor device according to a first embodiment, FIG. 2 is a cross-sectional view showing an example about a structure of a main part of the semiconductor device shown in FIG. 1; and FIG. 3 is a plan view showing the structure of the main part of the semiconductor device shown in FIG. 2.

A semiconductor device of a first embodiment shown in FIG. 1 is a Si (silicon) photonics device such as a semiconductor module having: a semiconductor chip provided with a light emitting source; and a semiconductor chip provided with an optical waveguide.

A structure of the Si photonics device (semiconductor device) 10 shown in FIGS. 1 to 3 will be described. The Si photonics device 10 includes: a first semiconductor chip 1 on whose main surface 1a first electrode pads 1c are formed; a second semiconductor chip 2 on whose main surface 2a second electrode pads 2c are formed and that is mounted above the main surface 1a of the first semiconductor chip 1; and a third semiconductor chip 3 on whose main surface 3a third electrode pads 3c are formed and that is mounted above the main surface 1a of the first semiconductor chip 1. Incidentally, the first electrode pads 1c in the first semiconductor chip 1 are electrically connected to an internal wiring 1e formed in one of wiring layers 1d on a front surface of a Si substrate. The third electrode pads 3c in the third semiconductor chip 3 are electrically connected to a wiring(s) of wiring layers 3d formed on the front surface of the Si substrate.

Here, the second semiconductor chip 2 is facedown-mounted above the first semiconductor chip 1 via a plurality of bump electrodes (first projecting electrodes) 4. Similarly, the third semiconductor chip 3 is also facedown-mounted above the first semiconductor chip 1 via a plurality of bump electrodes (second projecting electrodes) 5. Therefore, a back surface 2b of the second semiconductor chip 2 and a back surface 3b of the third semiconductor chip 3 face upward, respectively, and a back surface 1b of the first semiconductor chip 1 faces in a lower direction opposite thereto.

In addition, a laser diode 2e is formed as a light emitting source in the second semiconductor chip 2, and a laser beam (light) 6 is emitted in a desired direction from the laser diode 2e. On the other hand, an optical waveguide 3f shown in FIG. 3 for taking in the laser beam (light) 6 emitted from the laser diode 2e is formed on the front surface of the Si substrate of the third semiconductor chip 3. A driver circuit(s) for driving the second semiconductor chip 2 and the third semiconductor chip 3, a signal processing circuit (s) (not shown), and/or the like are incorporated in the first semiconductor chip 1. For example, a drive/modulation driver SOC and the like are mounted on the first semiconductor chip 1.

Further, a resin layer 1f is provided on a part of a main surface 1a of the first semiconductor chip 1 in the Si photonics device 10 of the first embodiment. Incidentally, as shown in FIGS. 2 and 3, the resin layer 1f is disposed at a position facing a main surface 2a of the second semiconductor chip 2. That is, the resin layer 1f on the main surface 1a of the first semiconductor chip 1 is disposed only in an area facing the main surface 2a of the second semiconductor chip 2, and is not disposed in an area facing a main surface 3a of the third semiconductor chip 3.

In addition, a plurality of upper-layer electrode pads (fourth electrode pads) 1g electrically connected to the first electrode pads 1c of the first semiconductor chip 1 by the internal wiring 1e of the wiring layer 1d are provided on the front surface of the resin layer 1f. Thereby, the plurality of upper-layer electrode pads 1g electrically connected to the first electrode pads 1c and provided on the resin layer 1f, and the plurality of second electrode pads 2c of the second semiconductor chip 2 are electrically connected via the plurality of bump electrodes 4, respectively.

Incidentally, the plurality of first electrode pads 1c of the first semiconductor chip 1, and the plurality of third electrode pads 3c of the third semiconductor chip 3 are electrically connected via the plurality of bump electrodes 5, respectively.

Then, in the first semiconductor chip 1, since the upper-layer electrode pad 1g is formed on the front surface of the resin layer 1f, the upper-layer electrode pad 1g is arranged above the first electrode pads 1c, so that the second semiconductor chip 2 is disposed on the resin layer 1f via the bump electrodes 4. In other words, the second semiconductor chip 2 is mounted on the first semiconductor chip 1 via the resin layer 1f, and thus is arranged at a position higher than the third semiconductor chip 3 by a thickness of the resin layer 1f.

In addition, the Si photonics device 10 is provided with an input/output substrate 7 for an interface of electric signals with its exterior, as shown in FIG. 1, and has an external terminal 7a for inputting/outputting the electric signals.

In addition, the Si photonics device 10 includes an optical fiber cable 8 connected to the optical waveguide 3f shown in FIG. 3 for outputting an optical signal. As a result, the laser beam 6 emitted from the laser diode 2e of the second semiconductor chip 2 is inputted into (taken in) the optical waveguide 3f of the third semiconductor chip 3, and further an optical signal is outputted externally from the optical waveguide 3f via the optical fiber cable 8. Incidentally, a grating coupler (not shown) or the like is used for converting an angle of the optical axis to the optical fiber cable 8 from the optical waveguide 3f.

Further, the Si photonics device 10 is provided with a sealing portion 9 for sealing the first semiconductor chip 1, the second semiconductor chip 2, the third semiconductor chip 3, a part of the input/output substrate 7, and a part of the optical fiber cable 8. Incidentally, the sealing portion 9 may be formed of, for example, a sealing resin, or may be formed of a metallic case or the like.

Further, in the first semiconductor chip 1, the resin layer 1f is formed at a position having substantially the same height as the uppermost layer (surface layer) of the wiring layer (multilayer wiring layer) 1d formed on the Si substrate, and further the upper-layer electrode pad 1g is formed on a front surface (upper surface) of the resin layer 1f. Incidentally, the resin layer 1f is formed of a relatively hard resin film such as a polyimide series solder resist film.

In addition, the bump electrodes 4 and 5 are bump electrodes made of, for example, solder, preferably copper or the like.

According to the Si photonics device 10 of the first embodiment, height of the second semiconductor chip 2 mounted on the resin layer 1f via the bump electrodes 4 can be adjusted by disposing the resin layer 1f on the main surface 1a of the first semiconductor chip 1, so that accuracy of position alignment between an optical axis 6a of the laser beam 6 emitted from the second semiconductor chip 2 and the optical waveguide 3f provided in the third semiconductor chip 3 can be enhanced.

As a result, the optical axis 6a of the second semiconductor chip 2 and the optical waveguide 3f of the third semiconductor chip 3 can be position-aligned with each other with high accuracy, so that the performance of the Si photonics device 10 can be improved.

Incidentally, since the optical axis 6a of the second semiconductor chip 2 and the optical waveguide 3f of the third semiconductor chip 3 can be position-aligned with high accuracy, an electrode pitch of the second semiconductor chip 2 and the third semiconductor chip 3 can be reduced in the Si photonics device 10. As a result, mounting cost can be reduced.

Further, since the optical axis 6a of the second semiconductor chip 2 and the optical waveguide 3f of the third semiconductor chip 3 can be position-aligned with high accuracy, a loss in inputting the laser beam 6 can be reduced. Furthermore, interference between adjacent electrode pads can be prevented. Therefore, mounting yield of each semiconductor chip can be improved.

Incidentally, as shown in FIG. 3, each of the bump electrodes 4 and 5 in the Si photonics device 10 is preferably provided with at least three or more in number. That is, alignment accuracy between the second semiconductor chip 2 and the third semiconductor chip 3 in each of X-Y-Z directions can be improved by making connection between the electrode pads (between chips) by the projecting electrodes at three or more points.

Thus, the optical axis 6a of the second semiconductor chip 2 and the optical waveguide 3f of the third semiconductor chip 3 can be position-aligned with further higher accuracy, so that the performance of the Si photonics device 10 can be further improved.

Second Embodiment

Figure 4:
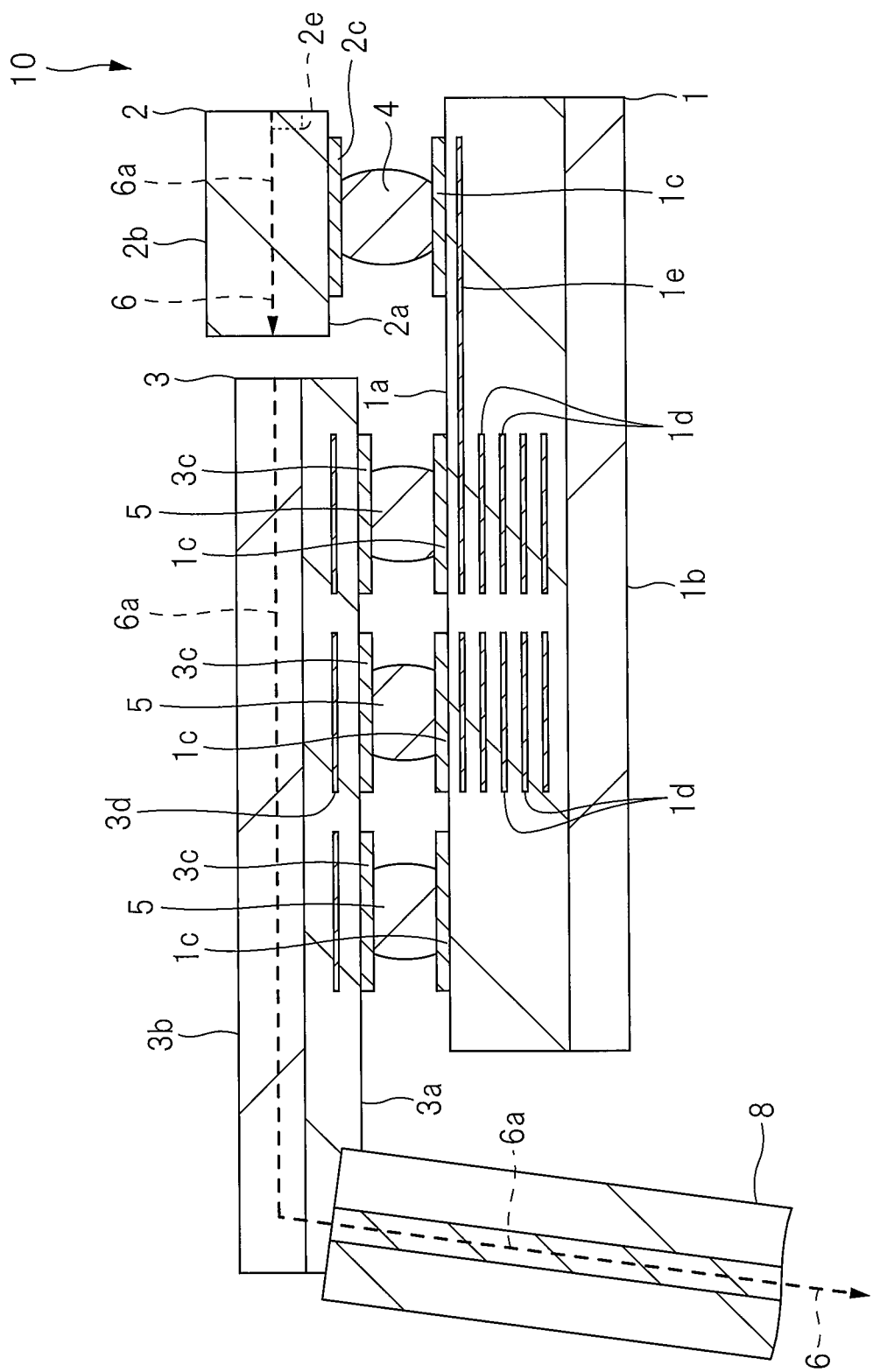
FIG. 4 is a cross-sectional view showing an example of the structure about a main part of a semiconductor device according to a second embodiment.
Figure 5:
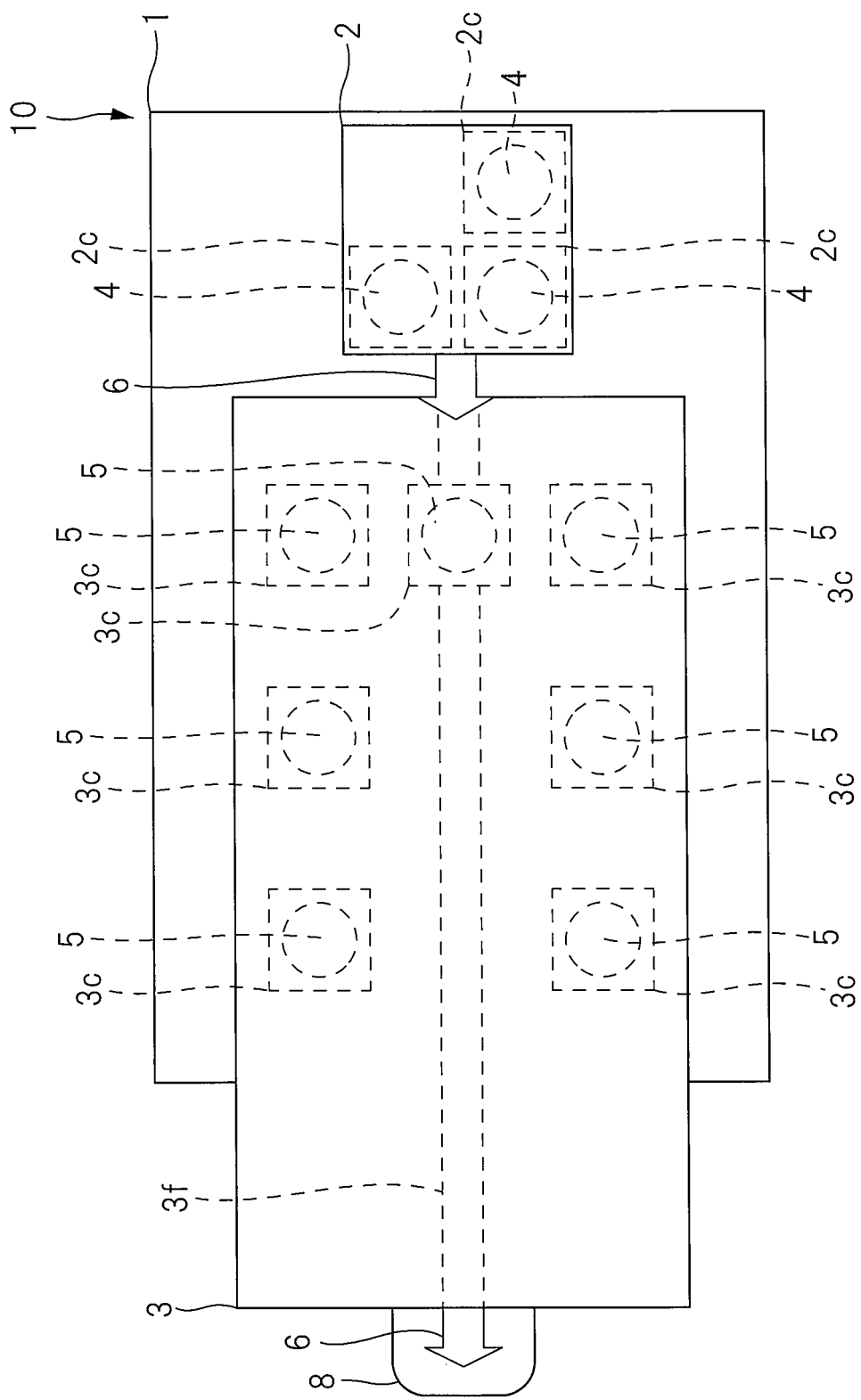
FIG. 5 is a plan view of the structure about the main part of the semiconductor device shown in FIG. 4.

FIG. 4 is a cross-sectional view showing an example about a structure of a main part of a semiconductor device according to a second embodiment, and FIG. 5 is a plan view of the structure about the main part of the semiconductor device shown in FIG. 4.

In a Si photonics device 10 of a second embodiment, by changing sizes (heights) of the projecting electrodes of the second semiconductor chip 2 and the third semiconductor chip 3, the accuracy of position-alignment is improved between the optical axis 6a of the laser beam 6 of the second semiconductor chip 2 and the optical axis 6a of the laser beam 6 taken in the optical waveguide 3f of the third semiconductor chip 3.

Incidentally, FIG. 4 shows the structure of only the main part of the Si photonics device 10, and the sealing portion 9 and the input/output substrate 7 shown in FIG. 1 are omitted.

Similarly to the Si photonics device 10 of the first embodiment, the Si photonics device 10 of the second embodiment shown in FIG. 4 includes: a first semiconductor chip 1 on whose main surface 1a the first electrode pads 1c are formed; a second semiconductor chip 2 on whose main surface 2a the second electrode pads 2c are formed; and a third semiconductor chip 3 on whose main surface 3a the third electrode pads 3c are formed. The second semiconductor chip 2 is facedown-mounted on the first semiconductor chip 1 via a plurality of bump electrodes (first projecting electrodes) 4. Similarly thereto, the third semiconductor chip 3 is also facedown-mounted on the first semiconductor chip 1 via a plurality of bump electrodes (second projecting electrodes) 5.

Incidentally, in the second semiconductor chip 2, a laser diode 2e is formed as a light emitting source, and a laser beam (light) 6 is emitted in a desired direction from the laser diode 2e. On the other hand, an optical waveguide 3f shown in FIG. 5 for taking in the laser beam (light) 6 emitted from the laser diode 2e is formed in the third semiconductor chip 3. Similarly to the first embodiment, a driver circuit for driving the second semiconductor chip 2 and the third semiconductor chip 3, a signal processing circuit (not shown), and the like are incorporated into the first semiconductor chip 1. For example, a drive/modulation driver SOC and the like are mounted on the first semiconductor chip 1.

In the Si photonics device 10 of the second embodiment, a height of each bump electrode 4 connected to the second semiconductor chip 2 is different from a height of each bump electrode 5 connected to the third semiconductor chip 3. To be specific, as shown in FIG. 4, the height of each bump electrode 5 becomes lower than the height of each bump electrode 4. In other words, the height of each bump electrode 4 is larger than that of each bump electrode 5.

Thus, similarly to the structure of the first embodiment, since a position of each bump electrode 4 is higher than that of each bump electrode 5, the second semiconductor chip 2 is arranged higher than the third semiconductor chip 3 to a degree of a difference between the positions.

Therefore, according to the Si photonics device 10 of the second embodiment, the height of the second semiconductor chip 2 can be adjusted by making the bump electrode 4 higher than the bump electrode 5, so that the accuracy of the position-alignment can be improved between the optical axis 6a of the laser beam 6 of the second semiconductor chip 2 and the optical waveguide 3f provided on the third semiconductor chip 3.

As a result, the optical axis 6a of the second semiconductor chip 2 and the optical waveguide 3f of the third semiconductor chip 3 can be position-aligned with each other with high accuracy, so that the performance of the Si photonics device 10 can be improved.

Incidentally, it is preferable to use a bump made of copper as a micro bump regarding the bump electrode 5 whose height is made low. In that case, although it is preferable to use a copper bump also regarding the bump electrode 4, solder bumps may be used regarding the bump electrodes 4 and 5. In addition, for the bump electrode 5 whose height is made low, the accuracy of alignment can be further improved by making the micro bumps as small as possible. For example, the micro bump to be made low in height is preferably a diameter of about 10 to 20 μm.

Also, the second embodiment has described a case where the bump electrode 4 is larger than the bump electrode 5 about a relationship between the sizes of the projecting electrodes. However, the relationship of the sizes of the projecting electrodes may be opposite. In other words, the size of the bump electrode 5 connected to the third semiconductor chip 3 may be larger than the size of the bump electrode 4 connected to the second semiconductor chip 2.

As described above, the position-alignment between the optical axis 6a of the second semiconductor chip 2 and the optical waveguide 3f of the third semiconductor chip 3 can be adjusted also by making the projecting electrodes of the second semiconductor chip 2 and the third semiconductor chip 3 different from each other in size.

Furthermore, even in a case where the projecting electrodes of the second semiconductor chip 2 and the third semiconductor chip 3 are made different from each other in size, it is preferable that the number of projecting electrodes of each semiconductor chip is set to three or more, and thereby the alignment accuracy between the second semiconductor chip 2 and the third semiconductor chip 3 can be further improved.

Third Embodiment

Figure 6:
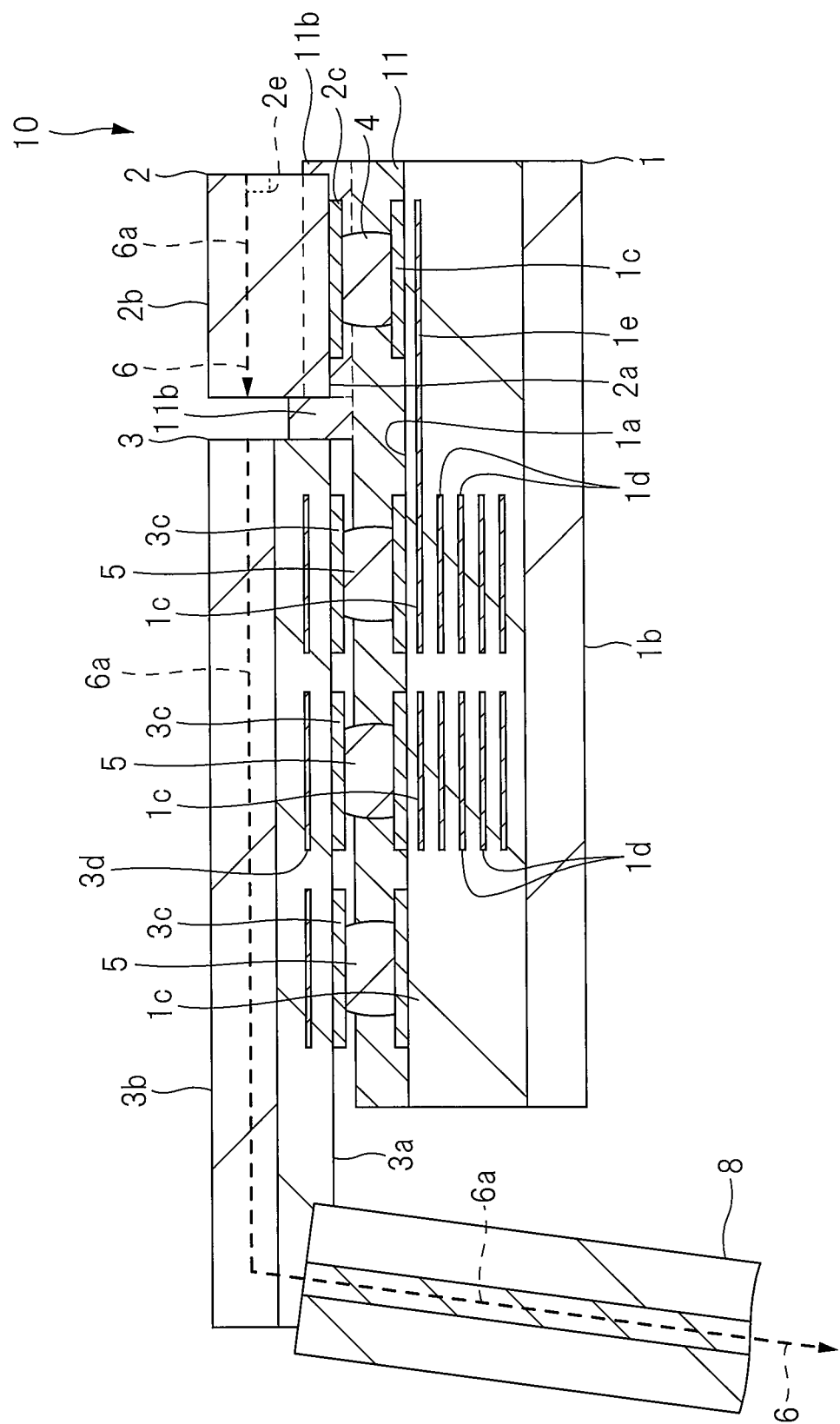
FIG. 6 is a cross-sectional view showing an example about a structure of a main part of a semiconductor device according to a third embodiment.

FIG. 6 is a cross-sectional view showing an example of the structure about a main part of a semiconductor device according to a third embodiment.

A Si photonics device 10 of a third embodiment is a semiconductor device similar to the Si photonics device 10 of the first embodiment, but differs from the Si photonics device 10 of the first embodiment in that a resin substrate 11 as an interposer is disposed between the first semiconductor chip 1 and the second semiconductor chip 2 and between the first semiconductor chip 1 and the third semiconductor chip 3.

A plurality of through holes 11a (see FIG. 7 described later) are formed in the resin substrate 11. The plurality of bump electrodes (projecting electrodes) 4 connecting the first semiconductor chip 1 and the second semiconductor chip 2, and the plurality of bump electrodes (projecting electrodes) 5 connecting the first semiconductor chip 1 and the third semiconductor chip 3 are disposed in the plurality of through holes 11a, respectively.

Incidentally, FIG. 6 shows a structure of only a main part of the Si photonics device 10, and omits the sealing portion 9 and the input/output substrate 7 shown in FIG. 1.

Similarly to the Si photonics device 10 of the first embodiment, the Si photonics device 10 of the third embodiment shown in FIG. 6 includes: the first semiconductor chip 1 on whose main surface 1a the first electrode pads 1c are formed; the second semiconductor chip 2 on whose main surface 2a the second electrode pads 2c are formed; and the third semiconductor chip 3 on whose main surface 3a the third electrode pads 3c are formed. Then, the second semiconductor chip 2 is facedown-mounted on the first semiconductor chip 1 via the plurality of bump electrodes (first projecting electrodes) 4, and likewise the third semiconductor chip 3 is also facedown-mounted on the first semiconductor chip 1 via the plurality of bump electrodes (second projecting electrodes) 5.

In the second semiconductor chip 2, the laser diode 2e is formed as a light emitting source, and the laser beam (light) 6 is emitted in a desired direction from the laser diode 2e. On the other hand, the optical waveguide 3f (see FIG. 5) for taking in the laser beam (light) 6 emitted from the laser diode 2e is formed in the third semiconductor chip 3. Incidentally, a driver circuit, a signal processing circuit (not shown), and the like for driving the second semiconductor chip 2 and the third semiconductor chip 3 are incorporated in the first semiconductor chip 1, similarly to the first embodiment. For example, a drive/modulation driver SOC and the like are mounted on the first semiconductor chip 1.

In the Si photonics device 10 according to the third embodiment, the resin substrate 11 as an interposer is mounted on the main surface 1a of the first semiconductor chip 1, and the second semiconductor chip 2 and the third semiconductor chip 3 are mounted on the resin substrate 11 via projecting electrodes, respectively. That is, the plurality of bump electrodes 4 for electrically connecting the first semiconductor chip 1 and the second semiconductor chip 2, and the plurality of bump electrodes 5 for electrically connecting the first semiconductor chip 1 and the third semiconductor chip 3 are disposed in the plurality of through holes 11a (see FIG. 7), respectively.

Incidentally, the resin substrate 11 is a substrate made of a resin having relatively high hardness such as a glass epoxy substrate.

In addition, positioning portions (convex portions) 11b protruding upward are formed on the upper surface of the resin substrate 11, and the second semiconductor chip 2 and the third semiconductor chip 3 are in contact with the positioning portions 11b as the convex portions. That is, the second semiconductor chip 2 and the third semiconductor chip 3 are fixed onto the resin substrate 11 in a state where their side surfaces abut on the positioning portion 11b, so that the second semiconductor chip 2 and the third semiconductor chip 3 are positioned and fixed in a horizontal direction (X-Y directions).

Next, assembly of the Si photonics device 10 of the third embodiment will be described.

Figure 7:
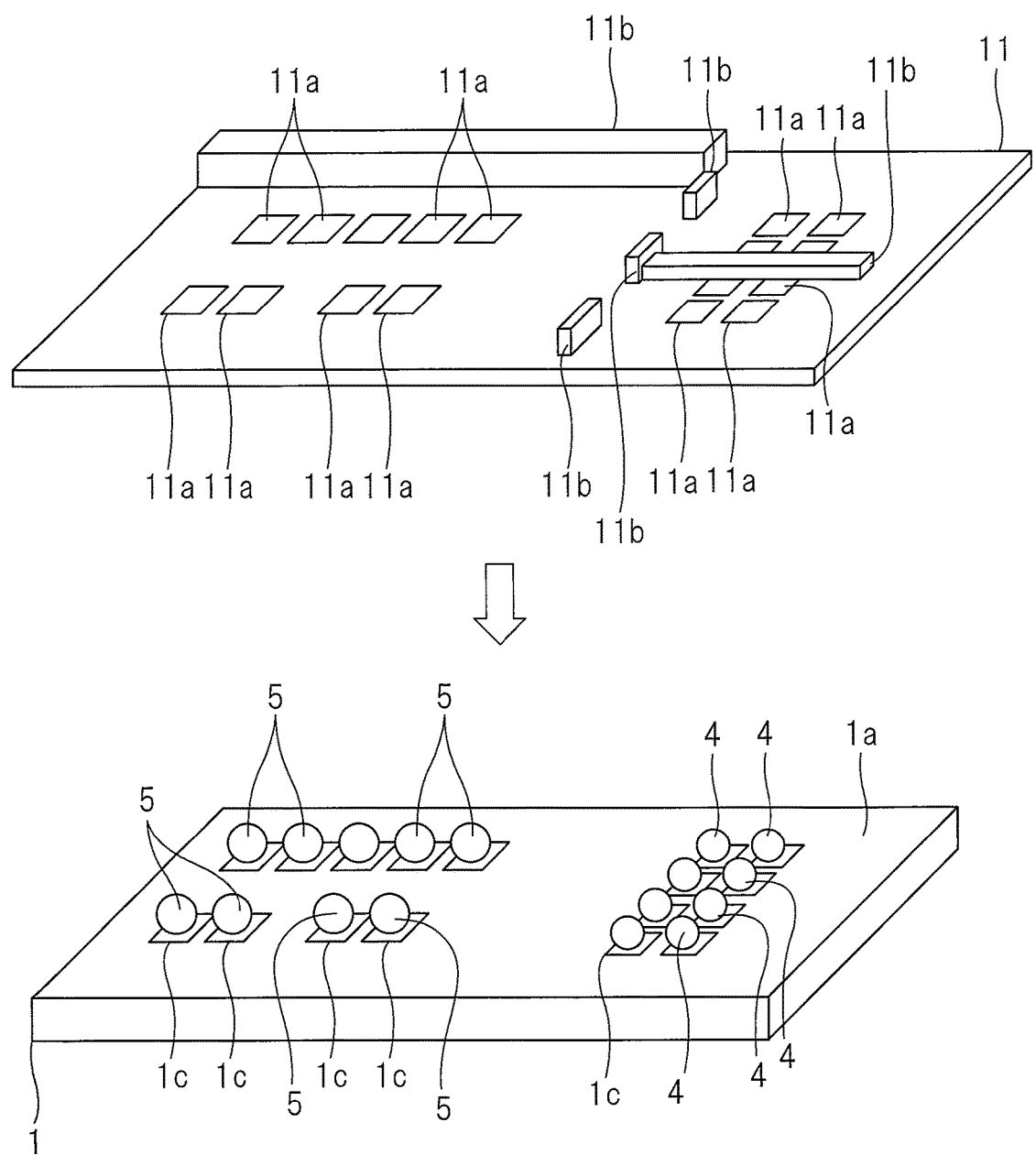
FIG. 7 is a perspective view showing an example about a structure before an interposer is attached in assembly of the semiconductor device according to the third embodiment.
Figure 8:
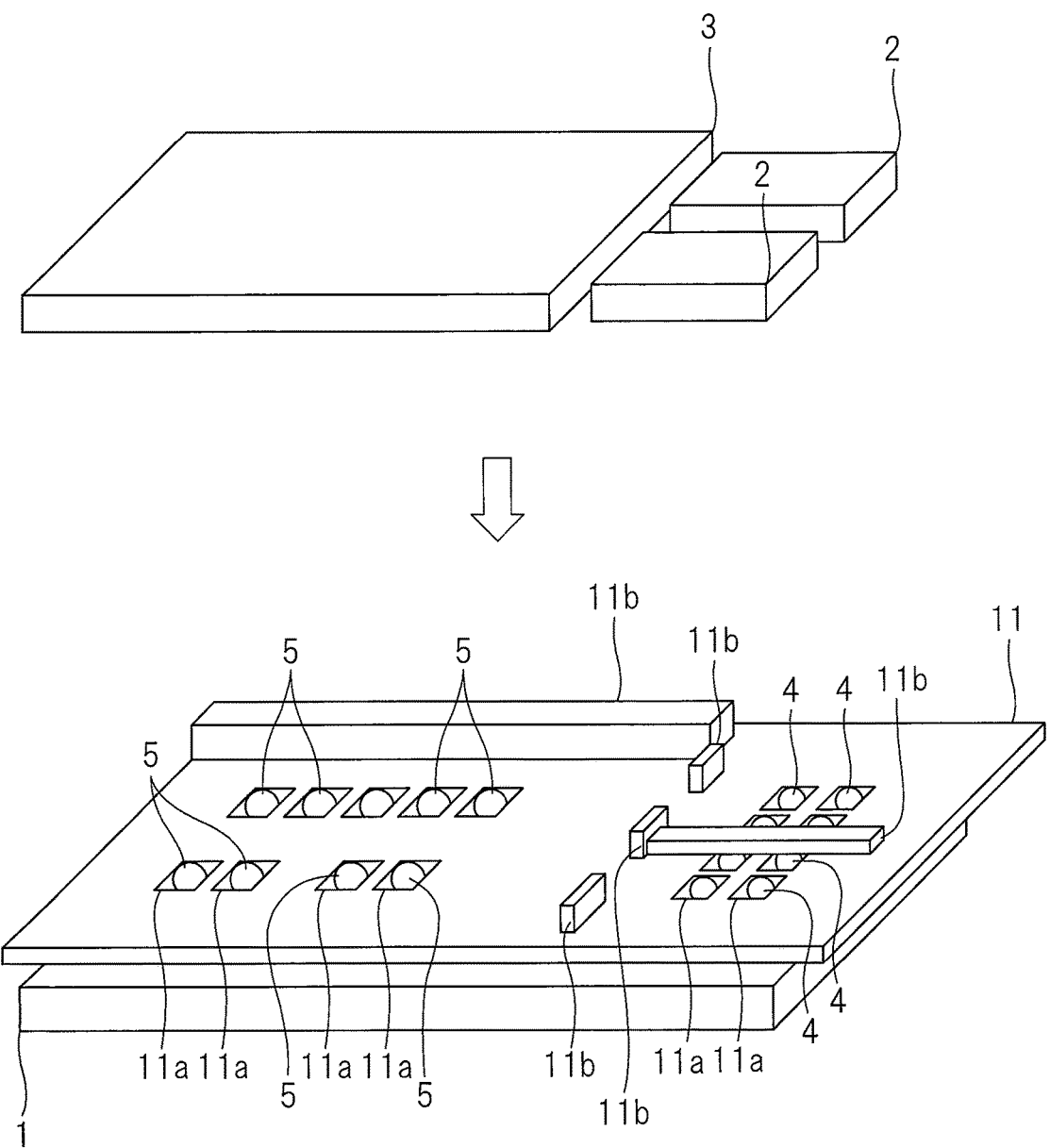
FIG. 8 is a perspective view showing an example about a structure after the interposer is attached in the assembly of the semiconductor device according to the third embodiment.
Figure 9:
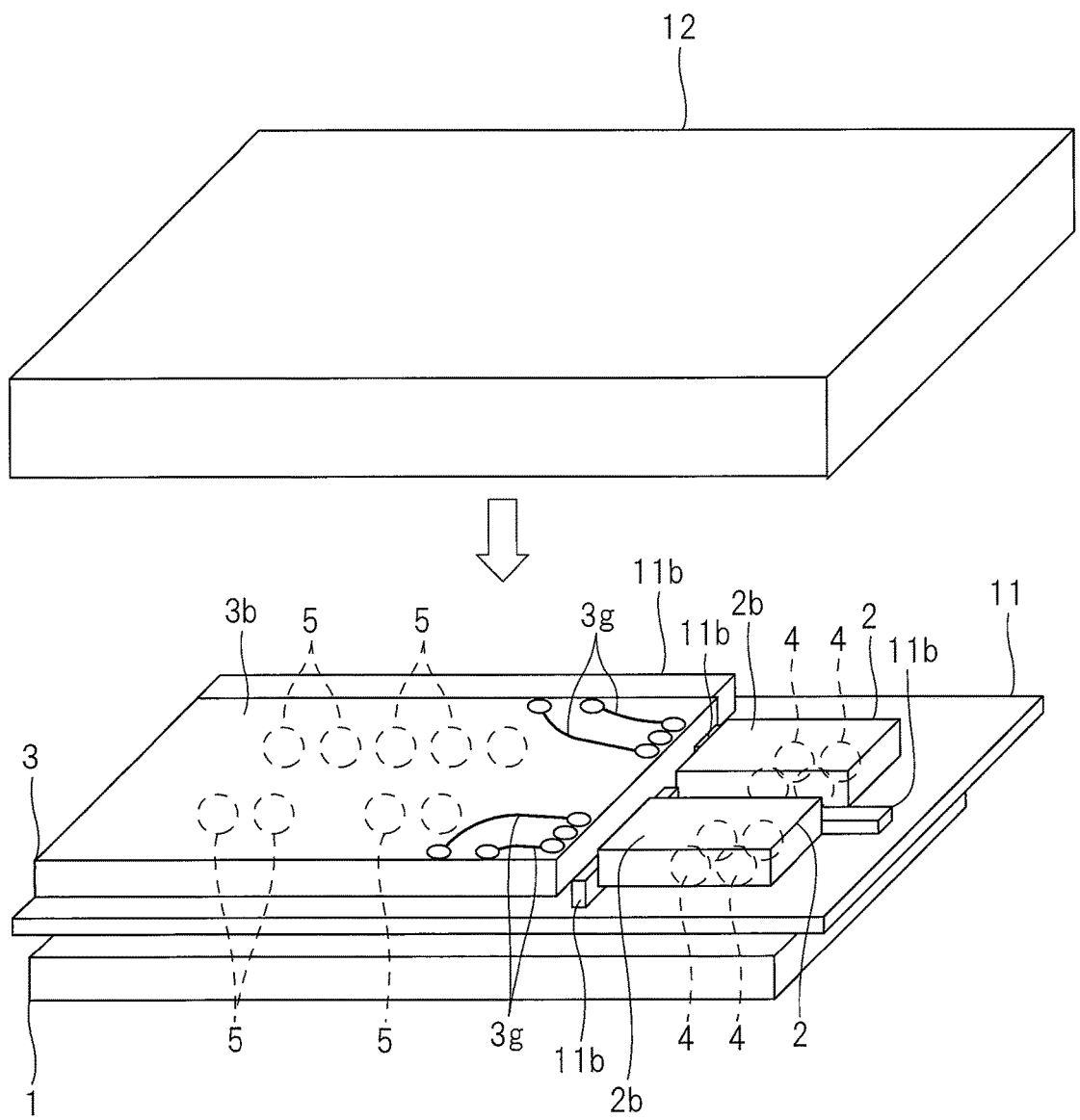
FIG. 9 is a perspective view showing an example about a structure when second and third semiconductor chips are mounted in the assembly of the semiconductor device according to the third embodiment.
Figure 10:
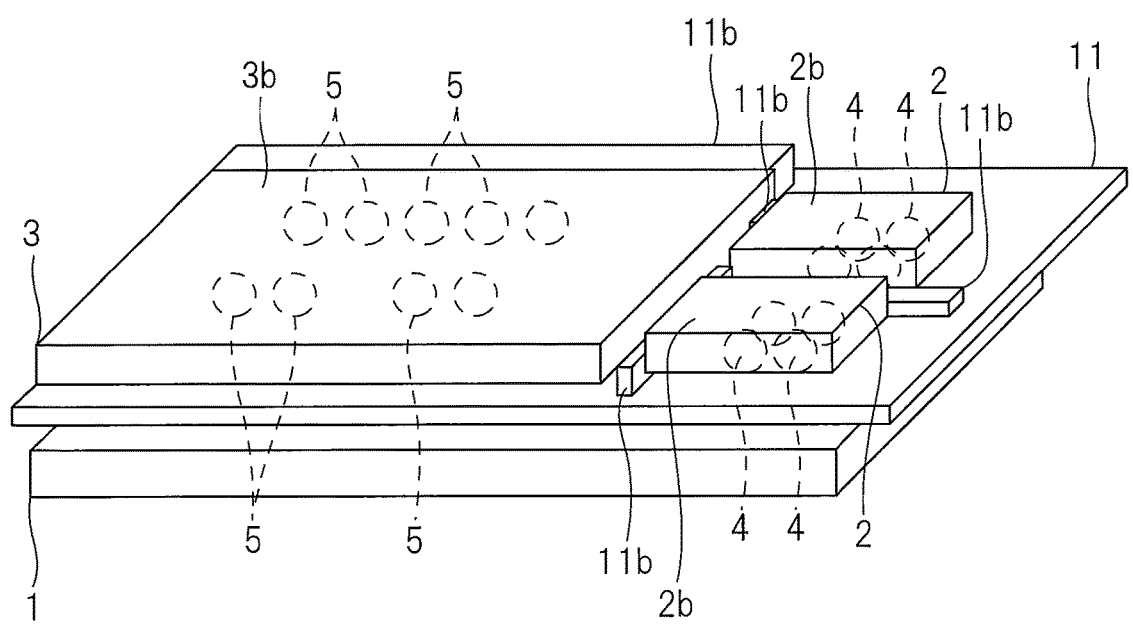
FIG. 10 is a perspective view showing an example about a structure after the second and third semiconductor chips are mounted in the assembly of the semiconductor device according to the third embodiment.
Figure 11:
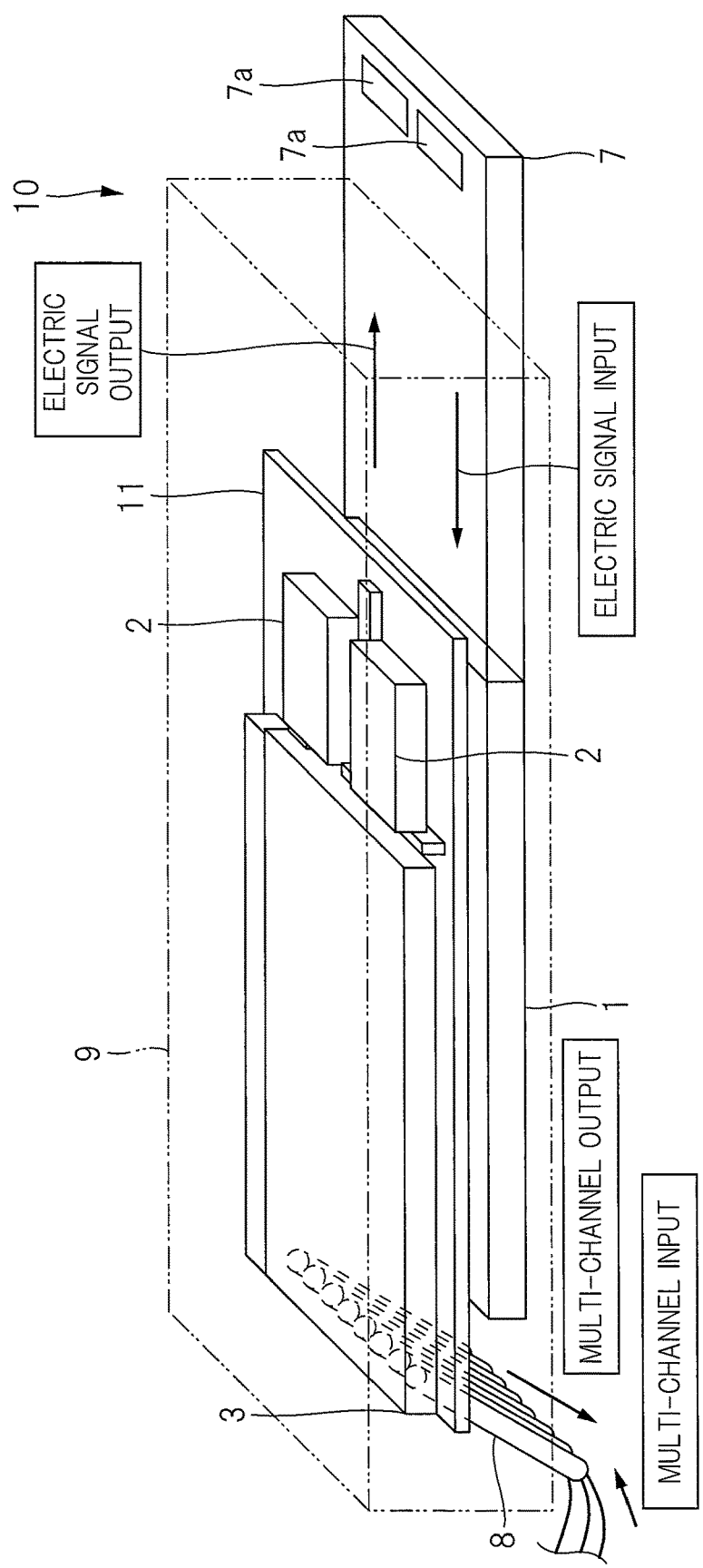
FIG. 11 is a perspective view showing an example about a structure after sealing in the assembly of the semiconductor device according to the third embodiment.

FIG. 7 is a perspective view showing an example about a structure before the interposer is attached in assembly of the semiconductor device of the third embodiment, and FIG. 8 is a perspective view showing an example about a structure after the interposer is attached in the assembly of the semiconductor device of the third embodiment. In addition, FIG. 9 is a perspective view showing an example about a structure when the second and third semiconductor chips are mounted in the assembly of the semiconductor device of the third embodiment; FIG. 10 is a perspective view showing an example about a structure after the second and the third semiconductor chips are mounted in the assembly of the semiconductor device of the third embodiment; and FIG. 11 is a perspective view showing an example about a structure after sealing in the assembly of the semiconductor device of the third embodiment.

First, prepared are the first semiconductor chip 1, the second semiconductor chip 2 having the laser diode 2e as a light emitting source, and the third semiconductor chip 3 for taking in the laser beam (light) 6 emitted from the laser diode 2e, the chips 1 to 3 being shown in FIG. 6.

Further, as shown in FIG. 7, the resin substrate 11 as an interposer is mounted on the main surface 1a of the first semiconductor chip 1.

At this time, the resin substrate 11 is mounted so that the plurality of bump electrodes 4 and the plurality of bump electrodes 5 provided on the first electrode pads 1c of the first semiconductor chip 1 are arranged in the plurality of through holes 11a of the resin substrate 11, respectively (see FIG. 8).

After mounting the resin substrate 11 as an interposer, as shown in FIG. 8, the second semiconductor chip 2 and the third semiconductor chip 3 are mounted on the resin substrate 11 so that the first semiconductor chip 1 and the second semiconductor chip 2 are electrically connected via the plurality of bump electrodes 4, and that the first semiconductor chip 1 and the third semiconductor chip 3 are electrically connected via the plurality of bump electrodes 5.

Incidentally, the positioning portions (convex portions) 11b protruding upward are formed on the upper surface of the resin substrate 11, so that in a step of mounting the second semiconductor chip 2 and the third semiconductor chip 3, each of the side surfaces of the second semiconductor chip 2 and the third semiconductor chip 3 is made to abut on the positioning portions 11b of the resin substrate 11, and the second semiconductor chip 2 and the third semiconductor chip 3 are mounted on the resin substrate 11.

Further, in the step of mounting the second semiconductor chip 2 and the third semiconductor chip 3, as shown in FIG. 9, the second semiconductor chip 2 and the third semiconductor chip 3 are mounted on the resin substrate 11 while a flat jig 12 is pressing the back surface 2b of the second semiconductor chip 2 and the back surface 3b of the third semiconductor chip 3 from above the second semiconductor chip 2 and the third semiconductor chip 3.

In other words, in the step of mounting the second semiconductor chip 2 and the third semiconductor chip 3, firstly, each of the side surfaces of the second semiconductor chip 2 and the third semiconductor chip 3 is made to abut on the positioning portions 11b, and the second semiconductor chip 2 and the third semiconductor chip 3 are roughly positioned (the optical axis 6a of the laser beam 6 emitted from the second semiconductor chip 2 and the optical waveguide 3f of the third semiconductor chip 3 are roughly aligned with each other in X-Y directions). Thereafter, low-temperature reflow is performed while the second semiconductor chip 2 and the third semiconductor chip 3 are pressed by the flat jig 12 from above them, and position-alignment in a Z-axis direction (chip thickness direction) is conducted, that is, the optical axis 6a of the second semiconductor chip 2 and the optical waveguide 3f of the third semiconductor chip 3 are position-aligned with each other.

Incidentally, at a time of the low temperature reflow or after completion of the low temperature reflow, a waveguide test is performed for an inspection of whether a position of the optical axis 6a of the laser beam 6 emitted from the laser diode 2e serving as the light emitting source of the second semiconductor chip 2 is aligned with an X-Y-Z-directional position of the optical waveguide 3f (see FIG. 3) provided on the third semiconductor chip 3.

In the above waveguide test, an inspection is performed by using inspection wirings 3g formed on the third semiconductor chip 3 as shown in FIG. 9. It is preferable that a terminal provided at one end of each inspection wiring 3g is formed on the side surface of the third semiconductor chip 3. Thus, even while the third semiconductor chip 3 is pressed from above by the jig 12, the waveguide test can be performed by bringing an inspection probe (not shown) or the like into contact with the terminal of the side surface.

As shown in FIG. 10, after mounting the second semiconductor chip 2 and the third semiconductor chip 3 including their alignment, the optical fiber cable 8 shown in FIG. 6 is fixed (connected) by using a photo-curing resin or the like. Further, the input/output substrate 7 (see FIG. 11 to be described later) is electrically connected and fixed to the first semiconductor chip 1.

Then, after fixing the optical fiber cable 8 and the input/output substrate 7, as shown in FIG. 11, resin molding is performed so as to cover, with a resin, the first semiconductor chip 1, the second semiconductor chip 2, the third semiconductor chip 3, the resin substrate 11, a part of the optical fiber cable 8, and a part of the input/output substrate 7. That is, covered with the sealing portion 9 are the first semiconductor chip 1, the second semiconductor chip 2, the third semiconductor chip 3, the resin substrate 11, a part of the optical fiber cable 8, and a part of the input/output substrate 7.

Thus, the assembly of the Si photonics device 10 of the third embodiment is completed.

According to the Si photonics device 10 of the third embodiment, by interposing the resin substrate 11 serving as an interposer between the upper and lower semiconductor chips subjected to bump connection by the bump electrodes 4 and 5, the height of the second semiconductor chip 2 with respect to the first semiconductor chip 1 can be aligned with the height of the third semiconductor chip 3 with respect to the first semiconductor chip 1.

Therefore, the accuracy of the position-alignment between the optical axis 6a of the laser beam 6 of the second semiconductor chip 2 and the optical waveguide 3f provided on the third semiconductor chip 3 can be improved. As a result, the optical axis 6a of the second semiconductor chip 2 and the optical waveguide 3f of the third semiconductor chip 3 can be position-aligned with high accuracy, so that performance of the Si photonics device 10 can be improved.

In addition, the second semiconductor chip 2 and the third semiconductor chip 3 are in contact with the positioning portions (convex portions) 11b of the resin substrate 11 as an interposer, and each of the second semiconductor chip 2 and the third semiconductor chip 3 is fixed onto the resin substrate 11 while each of them abuts on the positioning portion 11b. Therefore, the second semiconductor chip 2 and the third semiconductor chip 3 are positioned also in the horizontal directions (X-Y directions).

Thus, the optical axis 6a of the laser beam 6 of the second semiconductor chip 2 and the optical waveguide 3f of the third semiconductor chip 3 can be position-aligned in the X-Y-Z directions. Therefore, the accuracy of the position-alignment between the optical axis 6a of the second semiconductor chip 2 and the axis of the optical waveguide 3f of the third semiconductor chip 3 can be increased three-dimensionally.

As a result, the performance of the Si photonics device 10 can be further improved.

In addition, according to a method of manufacturing the Si photonics device 10 of the third embodiment, by using the interposer (resin substrate 11) and the jig 12 to bring them into contact with the semiconductor chips and assemble the device, a heat radiation effect of each semiconductor chip can be improved, so that a characteristic change of the laser diode 2e due to heat can be alleviated. As a result, reliability of the Si photonics device 10 can be improved.

Further, by conducting the waveguide test after mounting the second semiconductor chip 2 and the third semiconductor chip 3 and before the resin sealing, defective products can be sorted out before forming the sealing portion 9, which makes it possible to replace the defective products at that point of time and reassemble the device. As a result, yield in the assembly work of the Si photonics device 10 can be improved.

Fourth Embodiment

Figure 12:
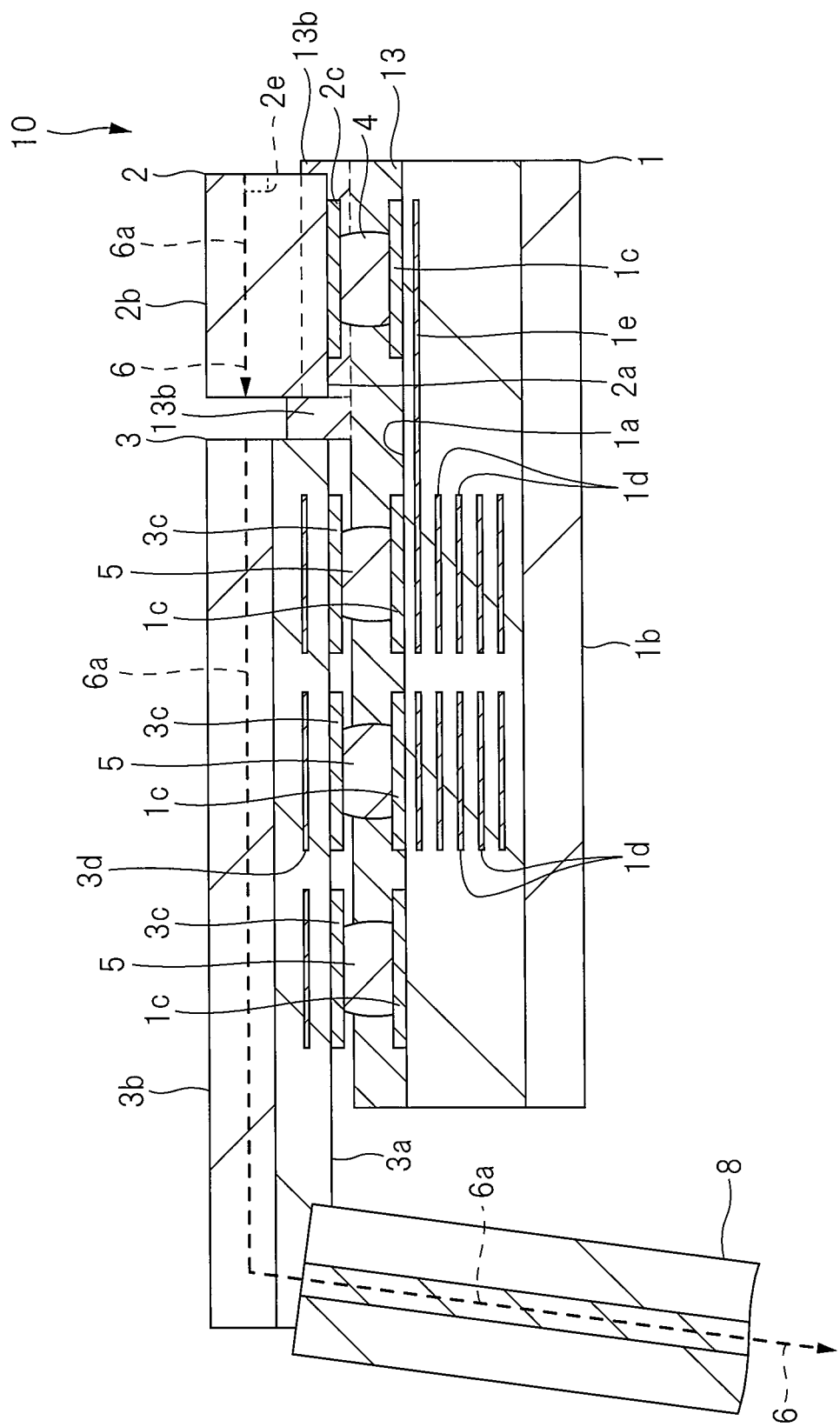
FIG. 12 is a cross-sectional view showing an example about a structure of a main part of a semiconductor device according to a fourth embodiment.

FIG. 12 is a cross-sectional view showing an example about a structure of a main part of a semiconductor device according to a fourth embodiment.

A Si photonics device 10 of a fourth embodiment is a semiconductor device similar to the Si photonics device 10 of the third embodiment, but is different from the Si photonics device 10 of the third embodiment in that a resist film 13 instead of the interposer is interposed between the upper and lower semiconductor chips. To be specific, the resist film 13 is disposed between the first semiconductor chip 1 and the second semiconductor chip 2 and between the first semiconductor chip 1 and the third semiconductor chip 3.

Then, a plurality of openings 13a (see FIG. 14 to be described later) are formed in the resist film 13, and the plurality of bump electrodes (projecting electrodes) 4 connecting the first semiconductor chip 1 and the second semiconductor chip 2, and the plurality of bump electrodes (projecting electrodes) 5 connecting the first semiconductor chip 1 and the third semiconductor chip 3 are arranged in the plurality of openings 13a, respectively.

Incidentally, FIG. 12 shows the structure of only the main part of the Si photonics device 10, and omits the sealing portion 9 and the input/output substrate 7 shown in FIG. 1.

Similarly to the Si photonics device 10 of the first embodiment, the Si photonics device 10 of the fourth embodiment shown in FIG. 12 includes: the first semiconductor chip 1 on whose main surface 1a the first electrode pads 1c are formed; the second semiconductor chip 2 on whose main surface 2a the second electrode pads 2c are formed; and the third semiconductor chip 3 on whose main surface 3a the third electrode pads 3c are formed. Then, the second semiconductor chip 2 is facedown-mounted on the first semiconductor chip 1 via the plurality of bump electrodes (first projecting electrodes) 4, and likewise the third semiconductor chip 3 is also facedown-mounted on the first semiconductor chip 1 via the plurality of bump electrodes (second projecting electrodes) 5.

In addition, the laser diode 2e is formed as a light emitting source in the second semiconductor chip 2, and the laser beam (light) 6 is emitted from the laser diode 2e in a desired direction. On the other hand, the optical waveguide 3f (see FIG. 5) for taking in the laser beam (light) 6 emitted from the laser diode 2e is formed in the third semiconductor chip 3. Incidentally, a driver circuit for driving the second semiconductor chip 2 and the third semiconductor chip 3, a signal processing circuit (not shown), and the like are incorporated in the first semiconductor chip 1 similarly to the first embodiment. For example, a drive/modulation driver SOC and the like are mounted on the first semiconductor chip 1.

Then, in the Si photonics device 10 according to the fourth embodiment, the resist film 13 which is an organic film is formed on the main surface 1a of the first semiconductor chip 1, and the second semiconductor chip 2 and the third semiconductor chip 3 are mounted on the resist film 13 via the projecting electrodes, respectively. In other words, the plurality of bump electrodes 4 for electrically connecting the first semiconductor chip 1 and the second semiconductor chip 2, and the plurality of bump electrodes 5 for electrically connecting the first semiconductor chip 1 and the third semiconductor chip 3 are disposed in the plurality of openings 13a (see FIG. 14) of the resist film 13, respectively.

Incidentally, the resist film 13 is, for example, an organic film such as a relatively hard resin film and is made of the same material as a permanent resist used for a structure body of a micro electro mechanical systems (MEMS) apparatus.

In addition, positioning portions (convex portions) 13b protruding upward are formed on an upper surface of the resist film 13, and the second semiconductor chip 2 and the third semiconductor chip 3 are in contact with the positioning portions 13b as convex portions. That is, the second semiconductor chip 2 and the third semiconductor chip 3 are fixed onto the resist film 13 while each of their side surfaces abut on the positioning portion 13b, so that the second semiconductor chip 2 and the third semiconductor chip 3 are positioned and fixed in the horizontal directions (X-Y directions).

Next, assembly of the Si photonics device 10 of the fourth embodiment will be described.

Figure 13:
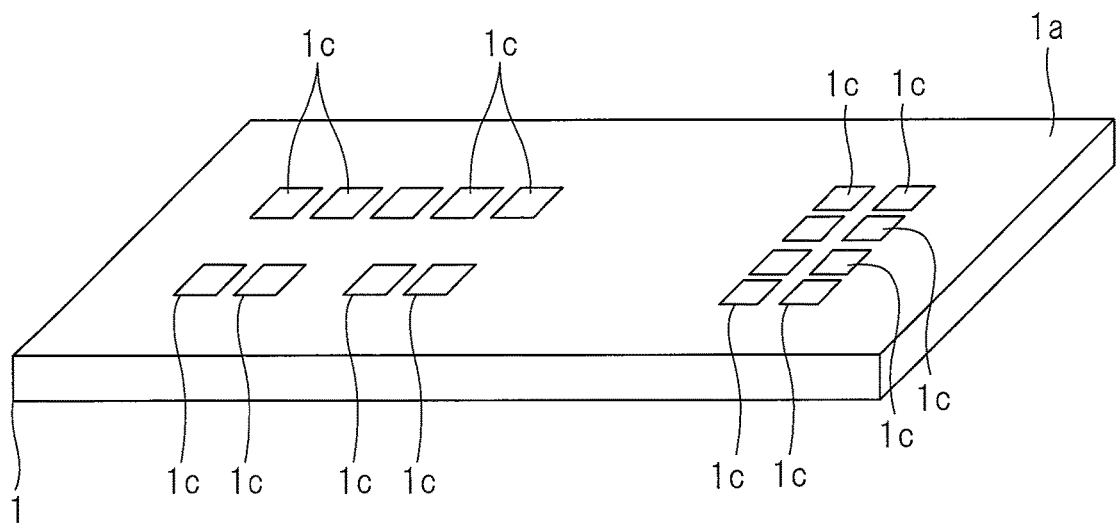
FIG. 13 is a perspective view showing an example about a structure of a first semiconductor chip used in assembly of the semiconductor device according to the fourth embodiment.
Figure 14:
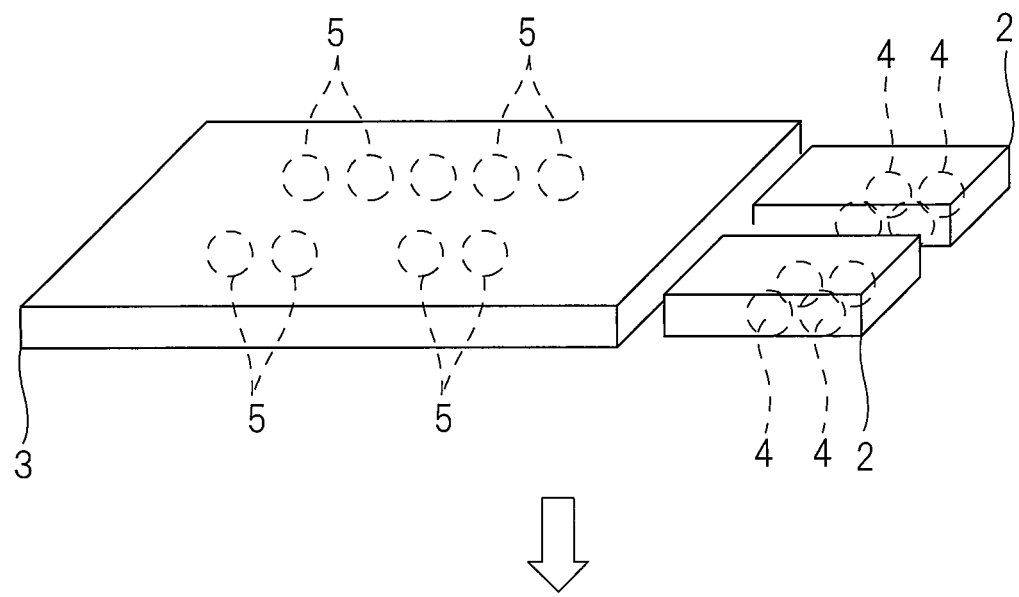
FIG. 14 is a perspective view showing an example about a structure before the second and third semiconductor chips are mounted in the assembly of the semiconductor device according to the fourth embodiment.
Figure 14:
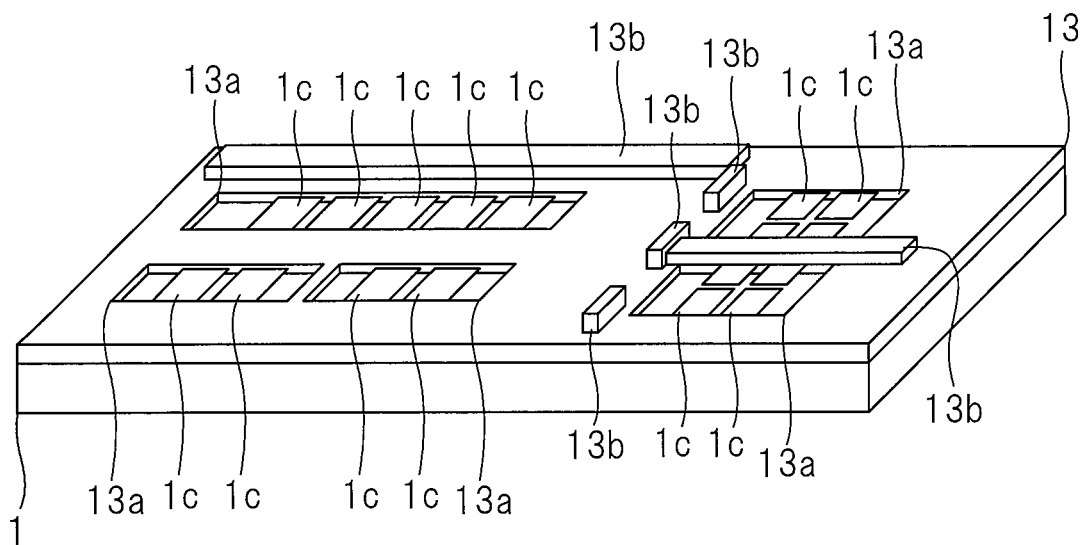
Figure 15:
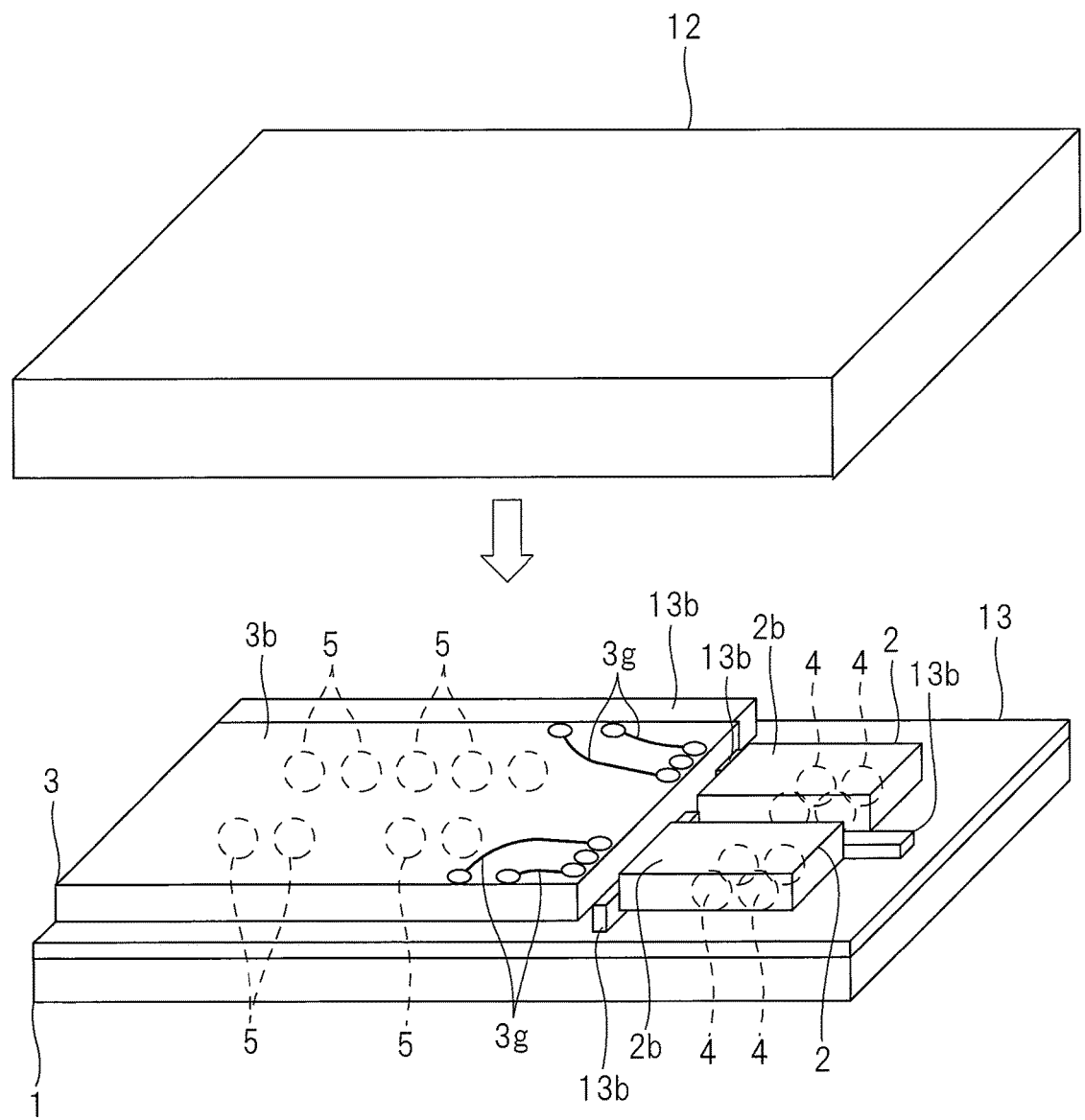
FIG. 15 is a perspective view showing an example about a structure when the second and third semiconductor chips are mounted in the assembly of the semiconductor device according to the fourth embodiment.
Figure 16:
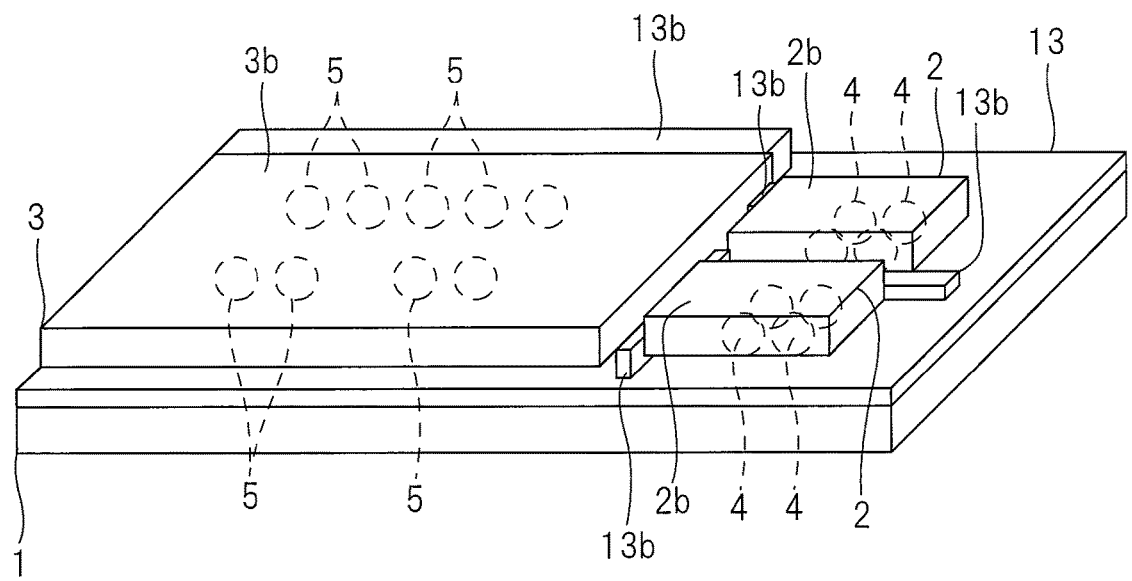
FIG. 16 is a perspective view showing an example about a structure after the second and third semiconductor chips are mounted in the assembly of the semiconductor device according to the fourth embodiment.
Figure 17:
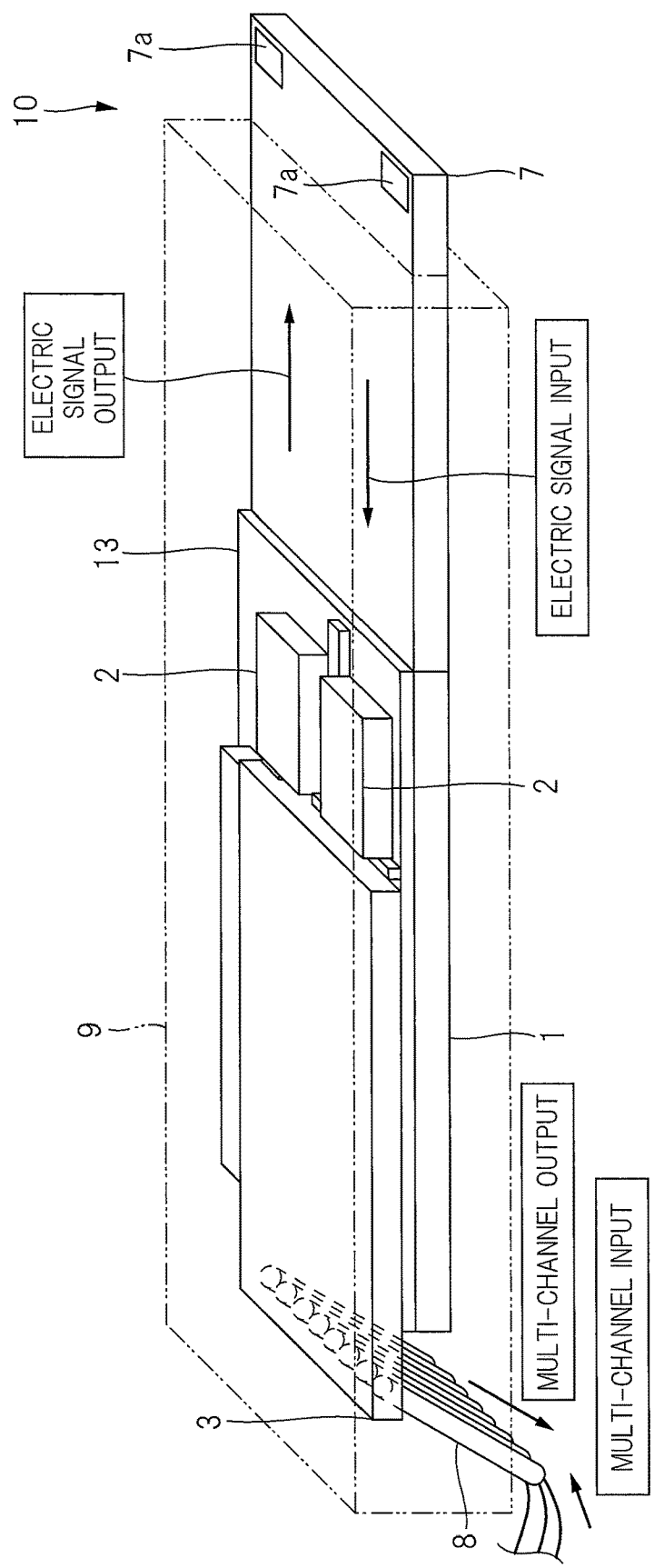
FIG. 17 is a perspective view showing an example about a structure after sealing in the assembly of the semiconductor device according to the fourth embodiment.

FIG. 13 is a perspective view showing an example about a structure of a first semiconductor chip to be used for assembling the semiconductor device of the fourth embodiment; FIG. 14 is a perspective view showing an example about a structure before mounting the second and third semiconductor chips in the assembly of the semiconductor device of the fourth embodiment; and FIG. 15 is a perspective view showing an example about a structure when the second and third semiconductor chips are mounted in the assembly of the semiconductor device of the fourth embodiment. In addition, FIG. 16 is a perspective view showing an example about a structure after mounting the second and third semiconductor chips in the assembly of the semiconductor device of the fourth embodiment; and FIG. 17 is a perspective view showing an example about a structure after sealing in the assembly of the semiconductor device of the fourth embodiment.

First, prepare are the first semiconductor chip 1, the second semiconductor chip 2 having the laser diode 2e serving as the light emitting source and shown in FIG. 12, and the third semiconductor chip 3 that takes in the laser beam (light) 6 emitted from the laser diode 2e, the chips being shown in FIGS. 13 and 14.

Next, as shown in FIG. 14, the resist film 13 is formed on the main surface 1a (see FIG. 12) of the first semiconductor chip 1 by patterning. Incidentally, a plurality of openings 13a are formed in the resist film 13 according to positions of first electrode pads 1c of the first semiconductor chip 1.

The second semiconductor chip 2 is provided with the plurality of bump electrodes 4, while the third semiconductor chip 3 is provided with the plurality of bump electrodes 5.

Next, as shown in FIG. 14, the second semiconductor chip 2 and the third semiconductor chip 3 are mounted on the resist film 13 so that the first semiconductor chip 1 and the second semiconductor chip 2 are electrically connected via the plurality of bump electrodes 4 and that the first semiconductor chip 1 and the third semiconductor chip 3 are electrically connected via the plurality of bump electrodes 5.

At this time, the plurality of bump electrodes 4 provided in the second semiconductor chip 2 and the plurality of bump electrodes 5 provided in the third semiconductor chip 3 are arranged in the plurality of openings 13a of the resist film 13, respectively.

In addition, the positioning portions (convex portions) 13b protruding upward are formed on the upper surface of the resist film 13, so that in mounting the second semiconductor chip 2 and the third semiconductor chip 3, each of the side surfaces of the second semiconductor chip 2 and the third semiconductor chip 3 is made to abut on the positioning portion 13b of the resist film 13, and the second semiconductor chip 2 and the third semiconductor chip 3 are mounted on the resist film 13.

Further, in the step of mounting the second semiconductor chip 2 and the third semiconductor chip 3, as shown in FIG. 15, the second semiconductor chip 2 and the third semiconductor chip 3 are mounted on the resist film 13 while the flat jig 12 is pressing the back surface 2b of the second semiconductor chip 2 and the back surface 3b of the third semiconductor chip 3 from above the second semiconductor chip 2 and the third semiconductor chip 3.

In other words, in the step of mounting the second semiconductor chip 2 and the third semiconductor chip 3, firstly, each of the side surfaces of the second semiconductor chip 2 and the third semiconductor chip 3 is made to abut on the positioning portion 13b, and the second semiconductor chip 2 and the third semiconductor chip 3 are roughly positioned (the optical axes 6a of the second semiconductor chip 2 and the third semiconductor chip 3 are roughly aligned in the X-Y directions). Thereafter, low-temperature reflow is performed while the second semiconductor chip 2 and the third semiconductor chip 3 are pressed from above by the flat jig 12, and thereby their Z-axis-directional (chip-thickness-directional) positions are aligned, that is, the optical axes 6a of the second semiconductor chip 2 and the third semiconductor chip 3 are position-aligned with each other.

Incidentally, at the time of the low temperature reflow or after the low temperature reflow, a waveguide test is performed for an inspection of whether the optical axis 6a of the laser beam 6 emitted from the laser diode 2e serving as the light emitting source of the second semiconductor chip 2 is aligned with a X-Y-Z-directional position of the optical waveguide 3f (see FIG. 3) provided in the third semiconductor chip.

In the above-mentioned waveguide test, as shown in FIG. 15, the inspection is performed by using the inspection wirings 3g formed on the third semiconductor chip 3. It is preferable that a terminal provided at each one end of the inspection wirings 3g is formed on the side surface of the third semiconductor chip 3. Thus, even while the chip is pressed from above by the jig 12, the waveguide test can be performed by bringing an inspection probe (not shown) or the like into contact with the terminal of the side surface.

As shown in FIG. 16, after mounting the second semiconductor chip 2 and the third semiconductor chip 3 including their alignment, the optical fiber cable 8 shown in FIG. 12 is fixed (connected) by using a photo-curing resin or the like. Further, the input/output substrate 7 (see FIG. 1) is electrically connected and fixed to the first semiconductor chip 1.

Then, after fixing the optical fiber cable 8 and the input/output substrate 7, as shown in FIG. 17, resin molding is performed so as to cover, with a resin, the first semiconductor chip 1, the second semiconductor chip 2, the third semiconductor chip 3, the resist film 13 (see FIG. 16), a part of the optical fiber cable 8, and a part of the input/output substrate 7. That is, the first semiconductor chip 1, the second semiconductor chip 2, the third semiconductor chip 3, the resist film 13, apart of the optical fiber cable 8, and a part of the input/output substrate 7 are covered with the sealing portion 9.

The assembly of the Si photonics device 10 of the fourth embodiment is completed by the foregoing.

According to the Si photonics device 10 of the fourth embodiment, by interposing the resist film 13 between the upper and lower semiconductor chips subjected to the bump connection by the bump electrodes 4 and 5, the height of the second semiconductor chip 2 with respect to the first semiconductor chip 1 can be aligned with the height of the third semiconductor chip 3 with respect to the first semiconductor chip 1.

This makes it possible to improve the accuracy of the position-alignment between the optical axis 6a of the laser beam 6 of the second semiconductor chip 2 and the optical waveguide 3f of the third semiconductor chip 3. As a result, the optical axis 6a of the second semiconductor chip 2 and the optical waveguide 3f of the third semiconductor chip 3 can be position-aligned with high accuracy, so that the performance of the Si photonics device 10 can be improved.

In addition, the second semiconductor chip 2 and the third semiconductor chip 3 are in contact with the positioning portions (convex portions) 13b of the resist film 13, so that by fixing the second semiconductor chip 2 and the third semiconductor chip 3 onto the resist film 13 in a state where each of the chips abuts on the positioning portion 13b, the second semiconductor chip 2 and the third semiconductor chip 3 are positioned also in the horizontal direction (X-Y directions).

Thus, the optical axis 6a of the laser beam 6 of the second semiconductor chip 2 and the optical waveguide 3f of the third semiconductor chip 3 can be position-aligned in the X-Y-Z directions. That is, the accuracy of the position-alignment between the optical axis 6a of the second semiconductor chip 2 and an axis of the optical waveguide 3f of the third semiconductor chip 3 can be three-dimensionally enhanced.

As a result, the performance of the Si photonics device 10 can be further improved.

In addition, according to a method of manufacturing the Si photonics device 10 of the fourth embodiment, since the resist film 13 is formed and the jig 12 is used so that these components are brought into contact with the semiconductor chips to assemble the device, it is possible to improve the heat radiation effect of each semiconductor chip and to alleviate the characteristic change of the laser diode 2e due to heat. As a result, the reliability of the Si photonics device 10 can be improved.

In addition, similarly to the third embodiment, by conducting the waveguide test after mounting the second semiconductor chip 2 and the third semiconductor chip 3 and before the resin sealing, defective products can be sorted out before forming the sealing portion 9, which makes it possible to replace the defective products at that point of time and reassemble the device. As a result, the yield in the assembly work of the Si photonics device 10 can be improved.

Fifth Embodiment

Figure 18:
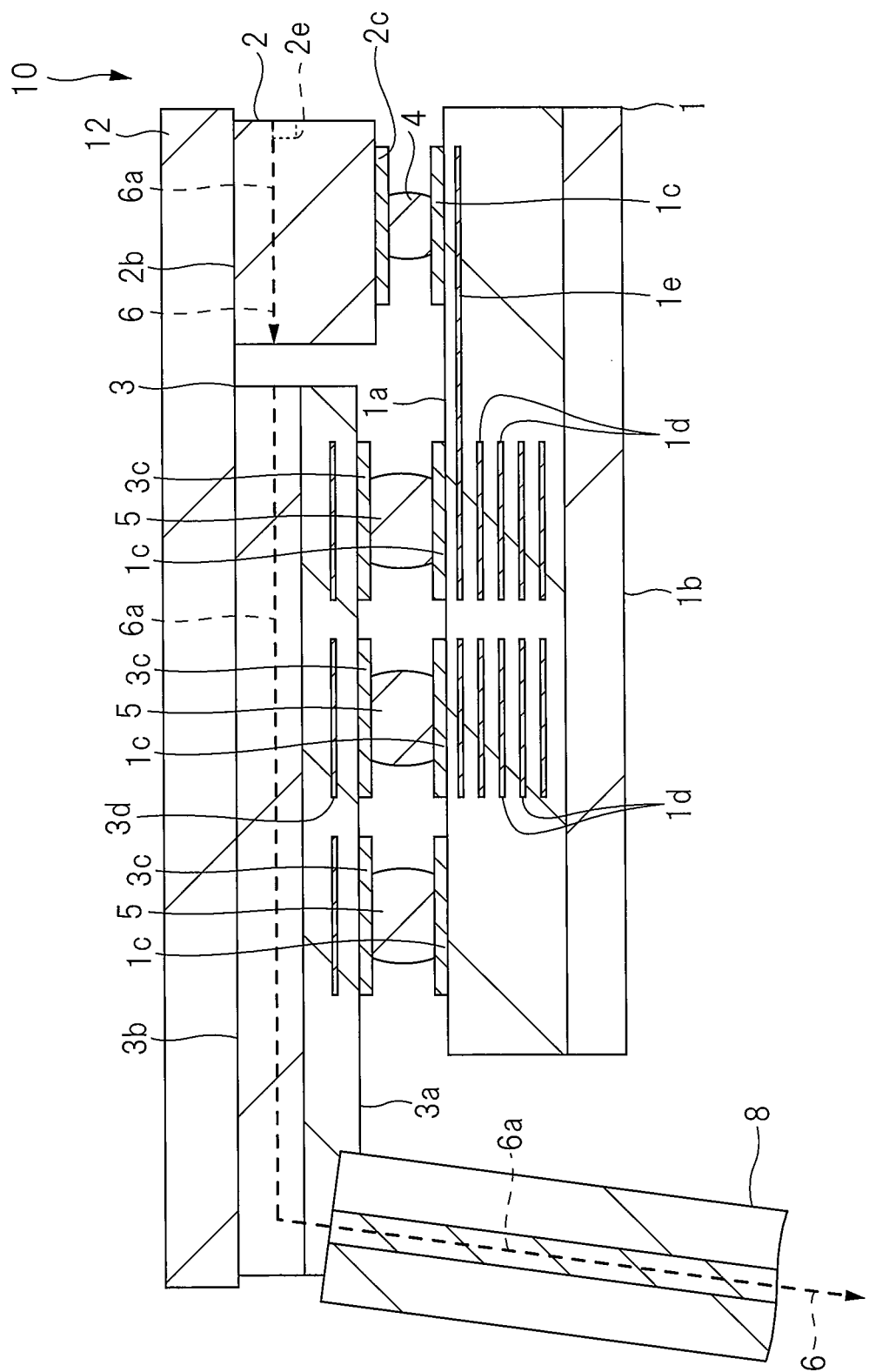
FIG. 18 is a cross-sectional view showing an example about a structure when second and third semiconductor chips are mounted in assembly of a semiconductor device according to a fifth embodiment.

FIG. 18 is a cross-sectional view showing an example about a structure when the second and third semiconductor chips are mounted in assembly of a semiconductor device of a fifth embodiment.

When the Si photonics device 10 of the fifth embodiment has the second semiconductor chip 2 and the third semiconductor chip 3 different from each other in thickness, the fifth embodiment will describe a case where the second semiconductor chip 2 is thicker than the third semiconductor chip 3. Furthermore, a structure of the fifth embodiment is a structure in which the resin layer 1f described in the first embodiment is not provided.

In this case, as shown in FIG. 18, the bump electrode 4, which is connected to the second semiconductor chip 2 and is smaller than the bump electrode 5 connected to the third semiconductor chip 3, is used. To be specific, a diameter of the bump electrode 4 connected to the second semiconductor chip 2 is made smaller than a diameter of the bump electrode 5 connected to the third semiconductor chip 3.

In other words, since the second semiconductor chip 2 is thicker than the third semiconductor chip 3 and the resin layer is not provided at a position facing the second semiconductor chip 2, a size of the bump electrode 4 connected to the second semiconductor chip 2 is made smaller than that of the bump electrode 5 connected to the third semiconductor chip 3.

Thus, the optical axis 6a of the laser beam 6 of the second semiconductor chip 2 and the optical waveguide 3f provided in the third semiconductor chip 3 can be position-aligned with each other. As a result, the performance of the Si photonics device 10 can be improved. Further, since optical axis alignment can be performed with high accuracy, input efficiency of light can be improved.

Incidentally, when the second semiconductor chip 2 and the third semiconductor chip 3 have the projecting electrodes different from each other in size, each of the sizes of both projecting electrodes is made as small as possible, so that the alignment accuracy is further improved. That is, it is preferable to use a micro bump made of copper or the like, which makes it possible to fine adjust the optical axis alignment.

Further, when the second semiconductor chip 2 and the third semiconductor chip 3 are different from each other in thickness (height), as shown in FIG. 18, the second semiconductor chip 2 and the third semiconductor chip 3 may be mounted while being pressed by the flat jig 12 from above at a time of reflowing in the semiconductor chip mounting step in the assembly work of the Si photonics device 10. Thus, the optical axis 6a of the second semiconductor chip 2 and the optical waveguide 3f (see FIG. 5) of the third semiconductor chip 3 can be position-aligned with each other, and the accuracy of the optical axis alignment can be further improved.

Next, a modification example of the fifth embodiment will be described.

Figure 19:
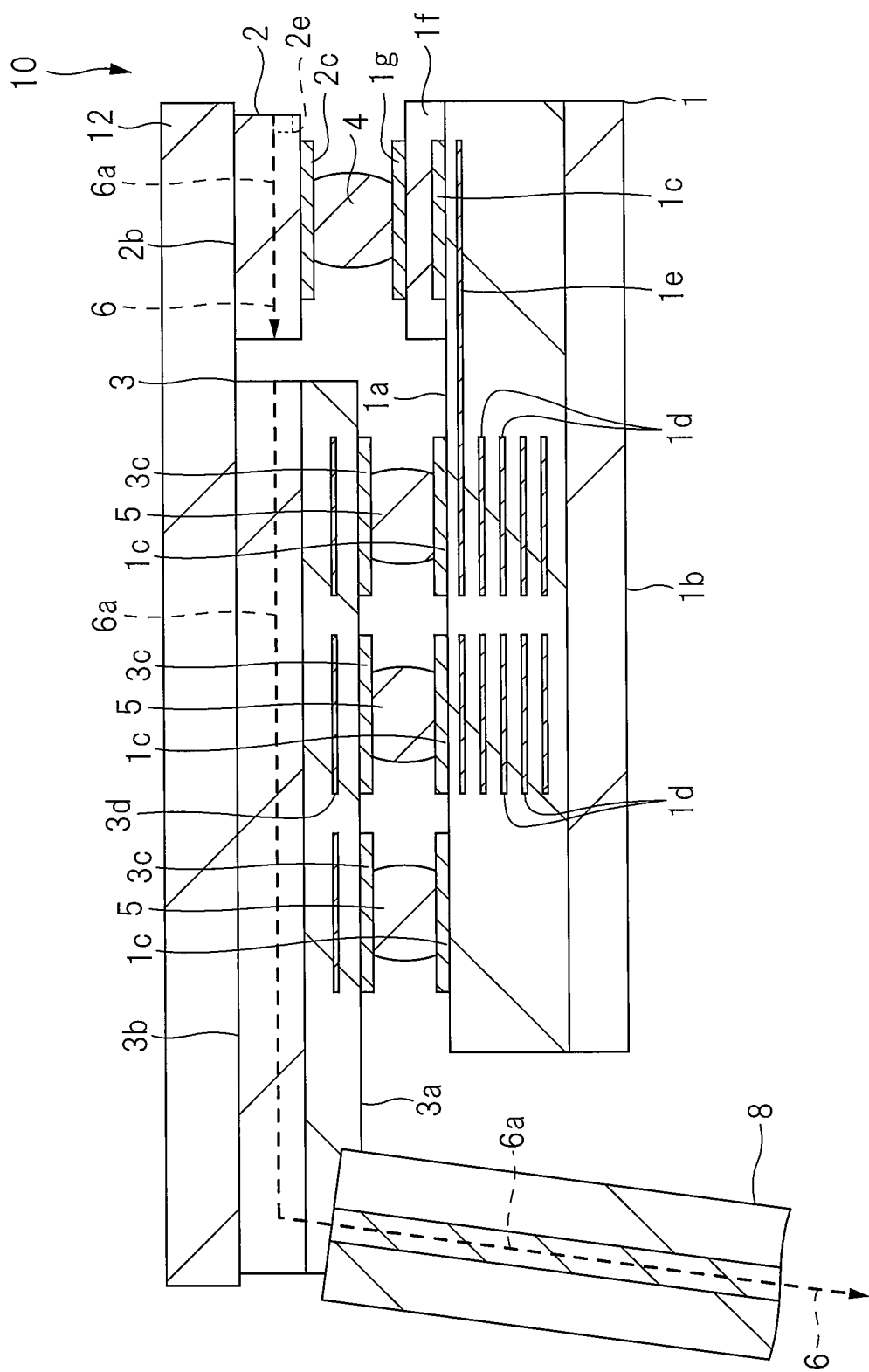
FIG. 19 is a cross-sectional view showing a structure when second and third semiconductor chips are mounted in assembly of a semiconductor device of a first modification example according to the fifth embodiment.

FIG. 19 is a cross-sectional view showing a structure when the second and third semiconductor chips are mounted in assembly of a semiconductor device according to a first modification example of the fifth embodiment; FIG. 20 is a cross-sectional view showing a structure when the second and third semiconductor chips are mounted in assembly of a semiconductor device according to a second modification example of the fifth embodiment; and FIG. 21 is a cross-sectional view showing a structure when the second and third semiconductor chips are mounted in assembly of a semiconductor device according to a third modification example of the fifth embodiment.

A Si photonics device 10 of a first modification example shown in FIG. 19 has the second semiconductor chip 2 and the third semiconductor chip 3 different from each other in thickness, and a thickness of the second semiconductor chip 2 is thinner (smaller) than that of the third semiconductor chip 3 (the thickness of the third semiconductor chip 3 is greater than that of the second semiconductor chip 2). Therefore, in a structure of the first modification example, the bump electrode 4 connected to the second semiconductor chip 2 is made larger than the bump electrode 5 connected to the third semiconductor chip 3, and a resin layer 1f similar to the resin layer 1f described in the first embodiment is provided on the main surface 1a of the first semiconductor chip 1.

Thus, a lack of the thinness of the second semiconductor chip 2 can be compensated by increasing the size of the bump electrode 4 and by interposing the resin layer 1f.

In other words, since the thickness of the second semiconductor chip 2 is thinner than that of the third semiconductor chip 3, the bump electrode 4 connected to the second semiconductor chip 2 is made larger than the bump electrode 5 connected to the third semiconductor chip 3, and further the resin layer 1f is provided at a position which faces the second semiconductor chip 2 on the main surface 1a of the first semiconductor chip 1.

Thus, the position of the optical axis 6a of the laser beam 6 of the second semiconductor chip 2 and the position of the optical waveguide 3f (see FIG. 5) of the third semiconductor chip 3 can be position-aligned with high accuracy, and the performance of the Si photonics device 10 can be improved consequently. Further, since the optical axis alignment can be performed with high accuracy, the input efficiency of light can be improved.

Incidentally, when the second semiconductor chip 2 and the third semiconductor chip 3 have the projecting electrodes different from each other in size, each of the sizes of both projecting electrodes is made as small as possible, so that the alignment accuracy is further improved. That is, a micro bump made of copper or the like is preferably used, which makes it possible to fine adjust the optical axis alignment.

In addition, when the second semiconductor chip 2 and the third semiconductor chip 3 are different from each other in thickness (height), as shown in FIG. 19, the second semiconductor chip 2 and the third semiconductor chip 3 may be mounted while being pressed by the flat jig 12 from above at the time of reflowing in the semiconductor chip mounting step in the assembly of the Si photonics device 10. Thus, the optical axis 6a of the second semiconductor chip 2 and the optical waveguide 3f of the third semiconductor chip 3 can be position-aligned with each other, and the accuracy of the optical axis alignment can be further improved.

Next, a Si photonics device 10 of a second modification example shown in FIG. 20 has a structure similar to the Si photonics device 10 of the first embodiment, and accuracy of amounting angle of the optical fiber cable 8 is enhanced in the Si photonics device 10.

In other words, in the Si photonics device 10 having the same structure as that of the Si photonics device 10 of the first embodiment, as shown at a portion P of FIG. 20, a side surface of the optical fiber cable 8 is in contact with an edge (edge portion) of the main surface 1a of the first semiconductor chip 1.

In other words, the first semiconductor chip 1 which serves also as alignment of mounting the optical fiber cable 8 is mounted.

Thus, the optical fiber cable 8 is fixed to the third semiconductor chip 3 in a state of maintaining a desired angle, so that the mounting angle of the optical fiber cable 8 can be made higher accuracy.

Incidentally, this structure can be realized by bringing, on a support substrate 14 that supports the first semiconductor chip 1, the side surface of the optical fiber cable 8 into contact with the edge (edge portion) of the main surface 1a of the first semiconductor chip 1 and fixing the optical fiber cable 8 when the optical fiber cable 8 is mounted on the third semiconductor chip 3 in the assembly of the Si photonics device 10.

According to the Si photonics device 10 of the second modification example, the optical fiber cable 8 can be fixed at a desired angle with high accuracy, and the accuracy of the optical axis alignment about the entirety of the components including the optical fiber cable 8 can be improved.

Furthermore, since the optical fiber cable 8 can be fixed at the desired angle with high accuracy, the accuracy of the optical axis alignment in the optical fiber cable 8, which is the output of the optical signal, can be further improved.

Next, a Si photonics device 10 of a third modification example shown in FIG. 21 has a structure similar to the Si photonics device 10 of the first embodiment, so that the accuracy of the mounting angle of the optical fiber cable 8 in the Si photonics device 10 is improved similarly to the second modification example.

In the Si photonics device 10 according to the third modification example, as indicated at a portion Q in FIG. 21, the side surface of the optical fiber cable 8 is in contact with the bump electrode (second projecting electrode) 5.

In other words, the first semiconductor chip 1 capable of performing the alignment of mounting the optical fiber cable 8 by the plurality of bump electrodes 5 is mounted.

Thus, the optical fiber cable 8 is fixed to the third semiconductor chip 3 in the state of maintaining the desired angle, so that the mounting angle of the optical fiber cable 8 can be made higher accuracy.

Incidentally, this structure can be realized by bringing, on the support substrate 14 that supports the first semiconductor chip 1, the side surface of the optical fiber cable 8 into contact with at least one bump electrode 5 out of the plurality of bump electrodes 5 and fixing the optical fiber cable 8 when the optical fiber cable 8 is mounted on the third semiconductor chip 3 in assembling the Si photonics device 10.

According to the Si photonics device 10 of the third modification example, the optical fiber cable 8 can be fixed at the desired angle with high accuracy similarly to the effect of the second modification example, and the accuracy of the optical axis alignment of the entirety of the components including the optical fiber cable 8 can be improved.

Furthermore, since the optical fiber cable 8 can be fixed at the desired angle with high accuracy, the accuracy of the optical axis alignment of the optical fiber cable 8, which is the output of the optical signal, can be further improved.

In the foregoing, the invention made by the inventors of the present invention has been concretely described based on the embodiments. However, it is needless to say that the present invention is not limited to the foregoing embodiments and various modifications and alterations can be made within the scope of the present invention.

Further, without departing from the gist of the technical ideas explained in the above embodiments, a combination of two embodiments, two modification examples, or an embodiment and a modification example can be applied to the present invention.

What is claimed is:

1. A semiconductor device comprising:
   a first semiconductor chip, a first electrode pad being formed on a main surface of the first semiconductor chip;
   a second semiconductor chip, a second electrode pad being formed on a main surface of the second semiconductor chip and being mounted on the main surface of the first semiconductor chip;
   a third semiconductor chip, a third electrode pad being formed on a main surface of the third semiconductor chip and being mounted on the main surface of the first semiconductor chip;
   a resin layer provided on the main surface of the first semiconductor chip and disposed to face the main surface of the second semiconductor chip;
   a first projecting electrode electrically connecting a fourth electrode pad and the second electrode pad of the second semiconductor chip, the fourth electrode pad being electrically connected to the first electrode pad and being provided on the resin layer; and
   a second projecting electrode electrically connecting the first electrode pad of the first semiconductor chip and the third electrode pad of the third semiconductor chip,
   wherein the second semiconductor chip includes a light emitting source,
   the third semiconductor chip has an optical waveguide for taking in light emitted from the light emitting source,
   the fourth electrode pad is disposed above the first electrode pad on the first semiconductor chip,
   the second semiconductor chip is mounted on the first semiconductor chip via the resin layer,
   an optical fiber cable transmitting an optical signal outputted from the third semiconductor chip is connected to the third semiconductor chip, and
   the optical fiber cable is in contact with an edge of the main surface of the first semiconductor chip.

2. The semiconductor device according to claim 1, wherein a height of the first projecting electrode and a height of the second projecting electrode are different from each other.

3. The semiconductor device according to claim 2, wherein the height of the second projecting electrode is lower than the height of the first projecting electrode.

4. The semiconductor device according to claim 1, wherein a thickness of the second semiconductor chip and a thickness of the third semiconductor chip are different from each other.

5. The semiconductor device according to claim 4, wherein the thickness of the third semiconductor chip is greater than the thickness of the second semiconductor chip.

6. The semiconductor device according to claim 1, wherein each of the first projecting electrode and the second projecting electrode to be provided is three or more in number.

7. The semiconductor device according to claim 1, wherein an optical fiber cable transmitting an optical signal outputted from the third semiconductor chip is connected to the third semiconductor chip, and
the optical fiber cable is in contact with the second projecting electrode.

* * * * *